US007208417B2

(12) United States Patent
Hiraoka

(10) Patent No.: US 7,208,417 B2
(45) Date of Patent: *Apr. 24, 2007

(54) APPARATUS AND METHOD FOR SUPPLYING CHEMICALS

(75) Inventor: Naoki Hiraoka, Kasugai (JP)

(73) Assignee: Fujitsu Limited, Kawasaki (JP)

(*) Notice: Subject to any disclaimer, the term of this patent is extended or adjusted under 35 U.S.C. 154(b) by 5 days.

This patent is subject to a terminal disclaimer.

(21) Appl. No.: 11/062,593

(22) Filed: Feb. 23, 2005

(65) Prior Publication Data

US 2005/0142883 A1 Jun. 30, 2005

Related U.S. Application Data

(62) Division of application No. 10/216,213, filed on Aug. 12, 2002, now Pat. No. 6,874,929, which is a division of application No. 09/050,947, filed on Mar. 31, 1998, now Pat. No. 6,457,852.

(30) Foreign Application Priority Data

Aug. 21, 1997 (JP) .................................. 9-225289
Nov. 17, 1997 (JP) .................................. 9-315197

(51) Int. Cl.
*H01L 21/461* (2006.01)
*H01L 21/302* (2006.01)

(52) U.S. Cl. ...................... 438/690; 438/691; 438/692; 438/693

(58) Field of Classification Search ..................... None
See application file for complete search history.

(56) References Cited

U.S. PATENT DOCUMENTS

| | | | | |
|---|---|---|---|---|
| 2,803,441 | A | 8/1957 | Stewart et al. | 259/1 |
| 3,948,490 | A | 4/1976 | Troope | 259/4 R |
| 4,059,929 | A | 11/1977 | Bishop | 51/263 |
| 4,242,841 | A | 1/1981 | Ushakov et al. | 51/263 |
| 4,580,699 | A | 4/1986 | Black et al. | 222/64 |
| 5,148,945 | A | 9/1992 | Geatz | 222/1 |
| 5,409,310 | A | 4/1995 | Owczarz | 366/136 |
| 5,502,685 | A | 3/1996 | Orlando | 366/12 |
| 5,722,447 | A | 3/1998 | Morgan et al. | 137/1 |
| 5,750,440 | A | 5/1998 | Vanell et al. | 438/692 |
| 5,800,056 | A | 9/1998 | Suzuki et al. | 366/152.4 |
| 5,803,599 | A | 9/1998 | Ferri, Jr. et al. | 366/134 |
| 5,868,278 | A | 2/1999 | Chen | 222/1 |
| 5,964,231 | A | 10/1999 | Kight et al. | 134/169 R |
| 6,040,245 | A * | 3/2000 | Sandhu et al. | 438/692 |
| 6,059,920 | A * | 5/2000 | Nojo et al. | 156/345.12 |
| 6,274,504 | B2 * | 8/2001 | Sanderfer et al. | 438/745 |

FOREIGN PATENT DOCUMENTS

| | | |
|---|---|---|
| JP | 63-88029 | 4/1988 |
| JP | 1-128829 | 9/1989 |
| JP | 5-251423 | 9/1993 |
| JP | 9-29637 | 2/1997 |

(Continued)

*Primary Examiner*—Duy-Vu N. Deo
(74) *Attorney, Agent, or Firm*—Armstrong, Kratz, Quintos, Hanson & Brooks, LLP

(57) ABSTRACT

A chemical supplying apparatus includes first and second mixing tanks for mixing and supplying chemical slurries used in a semiconductor fabrication process. The slurries are alternately provided from the first and second mixing tanks such that the slurry is continuously available to a precessing apparatus for maximum efficiency. While one of the tanks is supplying the slurry, the other tank is cleaned and then used to prepare a new batch of the slurry.

10 Claims, 9 Drawing Sheets

FOREIGN PATENT DOCUMENTS

| | | |
|---|---|---|
| JP | 9-139334 | 5/1997 |
| JP | 9-290368 | 11/1997 |
| WO | 96/02319 | 2/1996 |

* cited by examiner

APPARATUS AND METHOD FOR SUPPLYING CHEMICALS

This application is a Divisional application of U.S. patent application Ser. No. 10/216,213, filed Aug. 12, 2002 which issued as U.S. Pat. No. 6,874,929, which is a Divisional application of U.S. patent application Ser. No. 09/050,947, filed Mar. 31, 1998, which issued as U.S. Pat. No. 6,457,852 on Oct. 1, 2002.

BACKGROUND OF THE INVENTION

The present invention relates generally to an apparatus and a process for supplying a chemical to processing units for producing semiconductor devices, and, more particularly to a process and apparatus for supplying a chemical prepared by diluting and mixing stock solutions to semiconductor production-processing units.

Various types of chemical supplying apparatus are employed in the production of semiconductor devices. The chemicals supplying apparatus supply chemicals, prepared by diluting stock solutions with pure water or by mixing a plurality of stock solutions, to processing units which are used to fabricate semiconductor devices. If a chemical supplied to the processing units is unstable due to changes in its composition, aggregation of finely divided particles contained in the chemicals, etc., the semiconductor devices will be defective. Accordingly, chemicals supplying apparatus which supply stable chemicals are required.

Conventional chemical supplying apparatus, for example, a slurry feeder which supplies a slurry to a chemical machine-polishing unit (hereinafter simply referred to as CMP unit) includes a first tank in which stock solutions are diluted and mixed to prepare the slurry and a second tank in which the slurry is stored. The slurry feeder first draws stock solution (e.g., a suspension of alumina serving as abrasive grains and a solution of ferric nitrate serving as an oxidizing agent) from stock solution tanks and supplies the stock solutions to the first tank. The slurry feeder also supplies pure water to the first tank to carry out diluting and mixing treatment, thereby forming a slurry having a predetermined concentration. The slurry feeder then feeds the slurry to the second tank to store the slurry therein. The slurry feeder supplies the slurry to CMP units employing various kinds of pumps based on commands from the CMP units during polishing treatment. When the amount of slurry in the second tank decreases to a preset level, the slurry feeder prepares a new batch of slurry to supplement the slurry in the second tank, ensuring storage of a sufficient amount of slurry in the second tank.

Slurries tend to aggregate when dried or at sites where they dwell. Accordingly, aggregation of a slurry in a passage through which the slurry flows prevents the slurry feeder from supplying the slurry. Unfortunately apparatuses for feeding only general fluids, which do not have mechanisms for flushing passages through which slurries flow, have conventionally been utilized as slurry feeders. Accordingly, the slurry in the passage or pipe aggregates, causing clogging of the pipe. In addition, agglomerates of abrasive grains can be supplied to CMP units and form scratches on the surfaces of wafers undergoing polishing treatment, leading to low wafer yield.

Further, in slurries, particularly metal slurries prepared by mixing and diluting a suspension of alumina serving as abrasive grains and a solution of ferric nitrate serving as an oxidizing agent, precipitation occurs relatively quickly. Thus, polishing rates (speed etc.) decrease over. Such reduction in the polishing rates means that the thus formed slurry has a predetermined tank life. However, in the system where slurries are continuously stored in the second tank, former batches of slurries remain in the tank, which causes variations in the wafer polishing period,. making it impossible to achieve high-accuracy polishing of wafers.

In the apparatus for supplying a chemical, since the chemical stored in the second tank evaporates, which changes concentrations of the components in the second tank, it is not preferred to store the chemical in the second tank over a long period. Accordingly, chemicals not used over long periods are frequently discarded, leading to waste of chemicals and stock solutions.

It is an objective of the present invention to provide an apparatus for supplying a chemical which can supply new batches of chemical solution stably.

SUMMARY OF THE INVENTION

To achieve the above objective, the present invention provides a chemical supply apparatus for preparing a mixture by mixing a plurality of stock chemicals and supplying the mixture to at least one processing unit, the apparatus comprising: a plurality of mixing tanks, each mixing tank having a capacity corresponding to an amount of the mixture required by the processing unit, the mixing tanks for preparing the mixture by mixing predetermined amounts of the stock chemicals; a main circulating pipe commonly connected to the plurality of mixing tanks and the processing unit for supplying the mixture in the mixing tanks to the processing unit; a plurality of circulating pipes connected to each of the mixing tanks, respectively, to circulate the mixture in each one of the mixing tanks; a plurality of liquid level sensors for respectively measuring the amount of liquid disposed in each of the mixing tanks; a plurality of selector valves respectively connected between each of the mixing tanks, the circulating pipes, and the main circulating pipe, for selectively connecting the mixing tanks to one of the main circulating pipe and its respective circulating pipe; and a control unit for controlling the selector valves based on the detected liquid levels in the mixing tanks such that one of the plurality of mixing tanks is connected to the main pipe and the other mixing tanks are connected to their respective circulating pipes, wherein a new mixture is prepared in the other mixing tanks while the one mixing tank is supplying its mixture to the processing unit and when the liquid level of the mixture in the one tank reaches a first predetermined low level, the control unit switches the selector valves such that one of the other mixing tanks supplies its mixture to the processing unit.

The present invention further provides a chemical supply apparatus for preparing a mixture by mixing a plurality of stock chemicals and supplying the mixture to at least one processing unit, the apparatus comprising: a first mixing tank and a second mixing tank, each having a capacity corresponding to an amount of the mixture required by the processing unit, each mixing tank for preparing a batch of the mixture by mixing predetermined amounts of the stock chemicals and water; a main circulating pipe commonly connected to the each of the first and second mixing tanks and the processing unit for supplying the mixture in the mixing tanks to the processing unit; a first circulating pipe and a second circulating pipe connected to the first and second mixing tanks, respectively, to circulate the mixture in each one of the mixing tanks; a liquid level sensor provided with each of the mixing tanks for respectively measuring the amount of liquid disposed in each of the mixing tanks; first and second selector valves respectively connected between each of the mixing tanks, the circulating pipes, and the main circulating pipe, for selectively connecting the mixing tanks to one of the main circulating pipe and its respective circulating pipe; and a control unit for controlling the selector valves based on the detected liquid levels in the mixing tanks, the control unit connecting one of the mixing tanks to the main circulating pipe and the other mixing tank to its circulating pipe, wherein when the liquid level of the mixture in the one tank reaches a first predetermined low level, the control unit begins to prepare a new batch of the mixture in the other mixing tank.

The present invention further provides a chemical supply apparatus for preparing a mixture by mixing a plurality of stock chemicals and supplying the mixture to at least one processing unit, the apparatus comprising: a plurality of stock chemical tanks for respectively storing the stock chemicals; a plurality of circulating tanks corresponding to the stock chemical tanks for circulating the stock chemicals, respectively; a feeding system for feeding predetermined amounts of the stock chemicals to the circulating tanks; a plurality of circulating pipes respectively connected to the circulating tanks, to circulate the mixture in each one of the circulating tanks under a predetermined liquid pressure; a circulating system for circulating the stock chemicals fed to the circulating tanks by way of the circulating pipes; and a plurality of nozzles respectively connected to the circulating pipes to spray the mixture into the processing unit, the nozzle preparing the mixture by mixing the stock chemicals therein immediately before the mixture is sprayed.

The present invention provides a method for preparing a mixture in a first mixing tank and a second mixing tank and supplying the mixture to a processing unit, the method comprising the steps of: mixing a plurality of stock chemicals to prepare the mixture in the first mixing tank; supplying the mixture to the processing unit; starting preparation of a new batch of the mixture in the second mixing tank when the liquid level of the mixture in the first mixing tank drops to a predetermined value; and supplying the mixture prepared in the second mixing tank to the processing unit when the liquid level of the mixture in the first mixing tank drops to a second predetermined value.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with the objects and advantages thereof, may best be understood by reference to the following description of the presently preferred embodiments together with the accompanying drawings in which.

DETAILED DESCRIPTION OF THE PREFERRED EMBODIMENTS

Figures 1, 10:
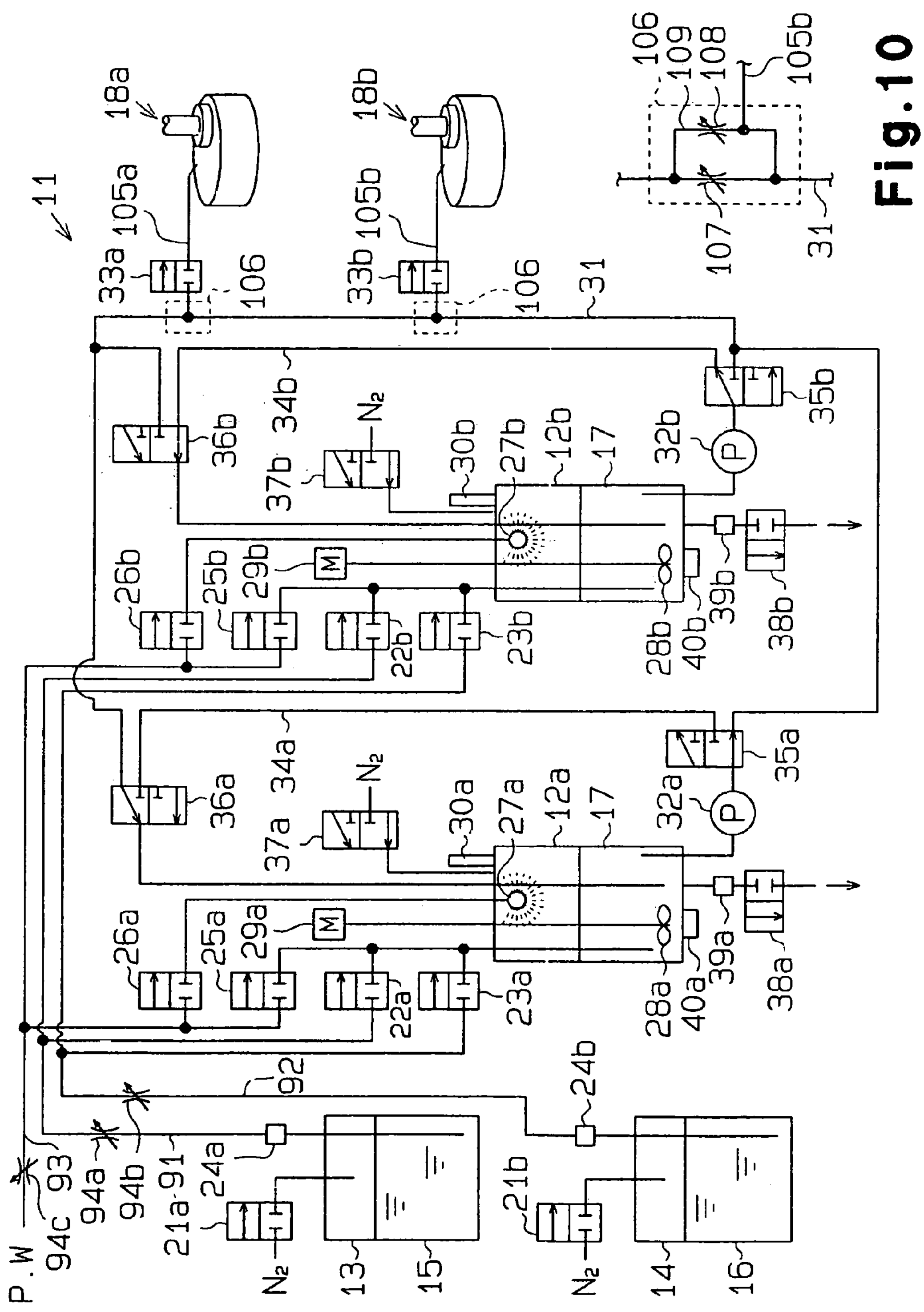
FIG. 1 is a schematic diagram showing a slurry feeder according to a first embodiment of the present invention.
FIG. 10 is a schematic diagram of a reduced section of the slurry feeder of FIG. 1.

In the drawings, like numerals are used to designate like elements throughout.

(First Embodiment)

A first embodiment of the present invention will be described referring to FIGS. 1 to 5.

Referring to FIG. 1, a slurry feeder 11 is provided with a plurality of mixing tanks (a first mixing tank 12*a* and a second mixing tank 12*b* in the first embodiment), a first stock solution tank 13 and a second stock solution tank 14. The first and second mixing tanks 12*a* and 12*b* are preferably of the same shape and have the substantially similar functions. More specifically, in the first and second mixing tanks 12*a* and 12*b*, stock solutions supplied from the first stock solution tank 13 and the second stock solution tank 14 are diluted and mixed to prepare chemical slurries. The mixing tanks 12*a* and 12*b* are also used to store and circulate slurries.

The first stock solution tank 13 stores a first stock solution 15, preferably an abrasive grain such as a suspension of alumina. The second stock solution tank 14 stores therein a second stock solution 16, which is preferably an oxidizing agent, such as a solution of ferric nitrate. The alumina suspension and the ferric nitrate solution are used to prepare a metal slurry for polishing metallic layers formed on wafers, such as of aluminum. The slurry feeder 11 prepares slurry 17 by diluting and mixing the stock solutions 15 and 16, in predetermined amounts, in the first and second mixing tanks 12*a* and 12*b*. The slurry feeder 11 then supplies the slurries 17 to CMP units 18*a* and 18*b*.

The first and second mixing tanks 12*a* and 12*b* are designed to have capacities such that they can store necessary amounts of slurries for polishing a predetermined number of wafers in the CMP units 18*a* and 18*b*. The capacities of the first and second mixing tanks 12*a* and 12*b* are designed to be smaller than those of the conventional mixing tank in which slurries are prepared and the storage tank in which the slurries are stored. The tanks 12*a* and 12*b* are designed to have a capacity of, for example, about 20 to 30 liters. Preferably, the capacity of the tanks 12*a* and 12*b* correspond to the volume of slurry necessary for processing one lot (50 pcs.) of wafers in the CMP units 18*a* and 18*b* at a flow rate of 100 to 150 ml/min. for 4 minutes.

The slurry feeder 11 prepares and supplies the slurry 17 using the first and second mixing tanks 12*a* and 12*b* alternately. That is, the slurry feeder 11 prepares a batch of slurry 17 corresponding to the amount to be consumed in the. CMP units 18*a* and 18*b* using the first and second mixing tanks 12*a* and 12*b* alternately. Accordingly, the slurries 17 prepared in the mixing tanks 12*a* and 12*b* are used up very quickly. Thus, none of the slurry 17 remains in the first and second mixing tanks 12*a* and 12*b*. Further, since the slurries 17 are used up quickly, the slurries 17 do not undergo deterioration (expiry of tank life).

The slurry feeder 11 can complete preparation (dilution and mixing) of a new batch of slurry 17 in the second mixing tank 12*b* during feeding of the slurry 17 in the first mixing tank 12*a*. Similarly, the slurry feeder 11 also completes preparation of a new batch of slurry 17 in the first mixing tank 12*a* during feeding of the slurry 17 in the second mixing tank 12*b*. Thus, the slurry 17 is alternately fed from the mixing tanks 12*a*, 12*b* in a continuous manner.

For example, when the level of the slurry 17 in the first mixing tank 12*a* drops to a preset preparation start level during feeding of the slurry 17 in the first mixing tank 12*a*, the slurry feeder 11 starts preparation of a slurry 17 in the second mixing tank 12*b*. Likewise, when the level of the slurry 17 in the second mixing tank 12*b* drops to a predetermined preparation start level during feeding of the slurry 17 in the second mixing tank 12*b*, the slurry feeder 11 starts preparation of another batch in the first mixing tank 12*a*.

The preparation start level is set such that the slurry 17 is continuously supplied to the CMP units 18*a*, 18*b*. More specifically, the preparation start level is set such that preparation of a new batch of slurry 17 is completed before the slurry 17 in the mixing tank 12*a* or 12*b* is used up. Accordingly, when the slurry 17 in one mixing tank 12*a* or 12*b* under feeding is used up, another batch of slurry 17 is already prepared in the other mixing tank 12*b* or 12*a*. The slurry feeder 11 then switches from the empty mixing tank 12*a* or 12*b* to the other mixing tank 12*b* or 12*a*. Thus, the fresh slurry 17 is continuously supplied to the CMP units 18*a* and 18*b*.

Further, the slurry feeder 11 carries out flushing of the mixing tanks 12*a* and 12*b* when the tanks 12*a*, 12*b* are empty. More specifically, while the slurry 17 in the first mixing tank 12*a* is being supplied to the CMP units 18*a* and 18*b*, the slurry feeder 11 carries out flushing of the second mixing tank 12*b* prior to preparing a next batch of the slurry 17 in the tank 12*b*. Similarly, flushing of the first mixing tank 12*a* occurs prior to preparation of a next batch of the slurry 17 in the tank 12*a*.

Thus, sediments in the mixing tanks 12*a* and 12*b* are removed by flushing of the tanks 12*a* and 12*b*. Further, since the mixing tanks 12*a* and 12*b* are of small capacity, they are subjected to flushing in short cycles, thus preventing cohesion of sediments. Accordingly, sediments are removed easily.

The structure of the first and second mixing tanks 12*a* and 12*b* will be described referring to preparation of slurries 17 and flushing of the tanks 12*a* and 12*b*.

The slurry feeder 11 force-feeds the stock solution 15 in the first stock solution tank 13 and the stock solution 16 in the second stock solution tank 14 to the first and second mixing tanks 12*a* and 12*b*. More specifically, a high-pressure inert gas (e.g., nitrogen gas) is supplied to the first and second stock solution tanks 13 and 14 under operation of supply valves 21*a* and 21*b*, respectively, by pumps (not shown) or other known means.

The first stock solution 15 stored in the first stock solution tank 13 is fed under the pressure of the nitrogen gas through a pipe 91 having valves 22*a* and 22*b* to the first and second mixing tanks 12*a* and 12*b*. Likewise, the second stock solution 16 stored in the second stock solution tank 14 is fed under the pressure of the nitrogen gas through a pipe 92 having valves 23*a* and 23*b* to the first and second mixing tanks 12*a* and 12*b*.

The pipes 91 and 92 have sensors 24*a* and 24*b*, respectively, for detecting the stock solutions 15 and 16 flowing through the pipes 91 and 92. The sensors 24*a* and 24*b* are preferably capacitance sensors. The sensors 24*a* and 24*b* output signals when the stock solutions 15 and 16 are flowing through the pipes 91 and 92. Accordingly, the slurry feeder 11 detects if the first and second stock solution tanks 13 and 14 are empty based on the output signals from the sensors 24*a* and 24*b*, respectively.

Pure water (P.W.) for diluting is supplied through a pipe 93 having valves 25*a* and 25*b* to the first and second mixing tanks 12*a* and 12*b*. The pipes 91, 92 and 93 are provided with flow control valves 94*a*, 94*b* and 94*c*, respectively.

The flow control valves 94*a* to 94*c* control the amounts of stock solutions 15 and 16 and the amount of pure water P.W. supplied to the first and second mixing tanks 12*a* and 12*b*. According to the present invention the pipes 91 to 93 have relatively large inside diameters so that the stock solutions 15 and 16 and the pure water are fed vigorously (ie. quickly) under the pressure of nitrogen gas, to the stock solution tanks 13 and 14. If the inside diameters of the pipes 91 to 93 are reduced to supply the stock solutions 15 and 16 and the pure water slowly, the time required for supplying each of them to the mixing tanks 12*a*, 12*b* increases.

The flow control valves 94*a* to 94*c* are used to reduce the flow rates of the stock solutions 15 and 16 and of the pure water when these liquids approach the target or required mixing amounts. Thus, the flow control valves 94*a*–94*c* facilitate the timing of closing the valves 22*a*, 23*a*, 25*a*, 22*b*, 23*b* and 25*b*. As a result, the amount of each liquid supplied to each mixing tank 12*a*, 12*b* coincides with the target amount, and a slurry having an accurate composition is easily prepared.

Pure water for flushing the tanks 12*a*, 12*b* is also supplied through the pipe 94 by way of valves 26*a* and 26*b* and nozzles 27*a* and 27*b*, respectively. The nozzles 27*a* and 27*b*, which are located in the first and second mixing tanks 12*a* and 12*b*, spray the pure water against the inner wall surfaces of the tanks 12*a* and 12*b*, respectively, and thus the slurries 17 remaining on the inner wall surfaces of the tanks 12*a* and 12*b* are washed off.

Stirrers 28*a* and 28*b* are provided in the first and second mixing tanks 12*a* and 12*b* respectively. The stirrers 28*a* and 28*b* are driven by motors 29*a* and 29*b* to stir the liquids in the first and second mixing tanks 12*a* and 12*b*. Thus, the slurries 17 are formed by mixing the stock solutions in the first and second mixing tanks 12*a* and 12*b* and diluting the mixed solutions with pure the water.

The first and second mixing tanks 12*a* and 12*b* contain liquid level sensors 30*a* and 30*b* respectively. The liquid level sensors 30*a* and 30*b* detect the levels of the liquids in the first and second mixing tanks 12*a* and 12*b* preferably, the liquid level sensors 30*a* and 30*b* are not in contact with the liquids in the tanks 12*a*, 12*b*, and output detection signals corresponding to the distance to the liquid levels respectively. For example, reflection type distance sensors utilizing laser beams or sensors utilizing ultrasonic waves may be employed.

Figure 4:
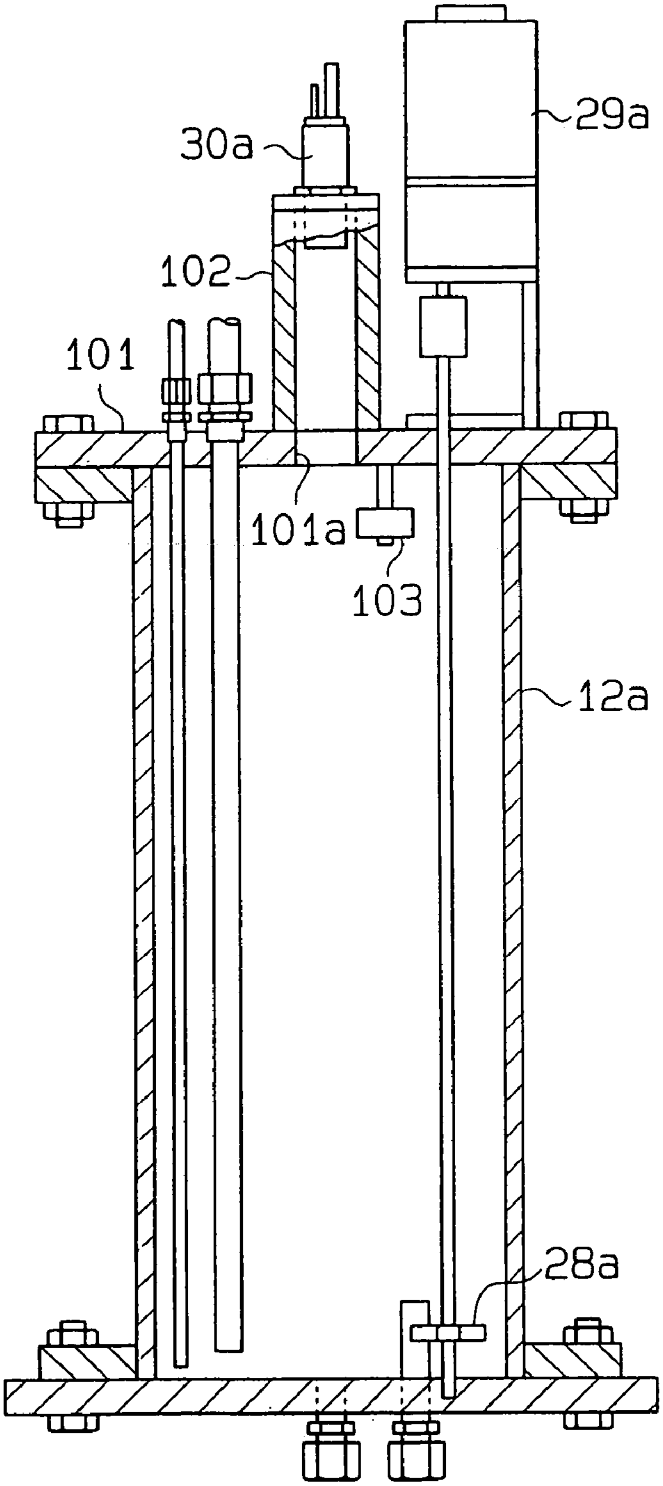
FIG. 4 is a vertical cross-sectional view showing a mixing tank.

The structure of the first mixing tank 12*a* will be described referring to FIG. 4. Since the first mixing tank 12*a* and the second mixing tank 12*b* are preferably of the same structure, description of the second mixing tank 12*b* is omitted.

The first mixing tank 12*a* has a cylindrical wall. The first mixing tank 12*a* has on a top plate 101 thereof a supporting part 102 for supporting the liquid level sensor 30*a*. The supporting part 102 is of a cylindrical shape and has the liquid level sensor 30*a* fixed at an upper end thereof. The liquid level sensor 30*a* detects the distance to the surface of the liquid in the first mixing tank 12*a* through an opening 101*a* defined in the top plate 101 and outputs a corresponding detection signal.

The supporting part 102 prevents the liquid level sensor 30*a* from being smeared sprayed or otherwise contaminated with the liquid in the first mixing tank 12*a* in order to assure accurate detection. If the liquid level sensor 30*a* is attached directly to the top plate 101, the liquid being supplied to the mixing tank 12*a* contacts the liquid level sensor 30*a*, and the liquid level sensor 30*a* cannot detect the liquid level accurately due to erroneous detection signals attributed to such contact. Accordingly, the liquid level sensor 30*a* is above the top plate 101 with the aid of the supporting part 102.

The first mixing tank 12*a* is also provided with an overflow sensor 103 for preventing the liquid supplied to the mixing tank 12*a* from overflowing. If the valve 23*a* becomes uncontrollable during feeding of liquids, supply of the liquids cannot be stopped, and the liquids will overflow the tank 12*a*. To prevent such overflow, when the overflow sensor 103 detects an overflow condition or when the sensor 103 is brought into contact with the liquid in the first mixing tank, 12*a*, supply of the liquids to the mixing tank 12*a* is stopped. To stop supply of the liquids, for example, the pumps supplying nitrogen to the stock solution tanks 13 and 14 are turned off. The overflow sensor 103 is positioned to provide adequate time to prevent overflow and also, not to inhibit normal operations.

The slurry feeder 11 calculates the levels of the liquids supplied to the mixing tanks 12*a* and 12*b* based on detection signals from the liquid level sensors 30*a* and 30*b* and supplies the stock solutions 15 and 16 and the pure water until the liquid levels reach predetermined heights.

The slurry feeder 11 meters the volumes of the liquids supplied to the mixing tanks 12*a* and 12*b* based on the calculated liquid levels and the volume of the tanks 12*a* and 12*b*. As described above, the slurry feeder 11 prepares a slurry 17 having a predetermined concentration.

Conventionally, float sensors, capacitance sensors, etc., have been employed for liquid level detection. Malfunction can occur in the float sensors, since movable parts supporting floats and mechanical switches which are operated by the floats are affected by liquids. Malfunction of the sensors inhibits accurate measurement of liquid levels. On the other hand, the capacitance sensors detect liquids remaining on the wall surfaces of tanks, which means that output signals from the sensors contain errors which inhibit accurate measurement of liquid levels.

In contrast the liquid level sensors 30*a* and 30*b* do not contact the liquids, have no movable parts, and are not readily contacted or contaminated by the liquids. The present structure obviates malfunction of the liquid level sensors 30*a* and 30*b*. Further, the output signals of the sensors 30*a* and 30*b* provide accurate measurement of liquid levels. Thus, the slurry feeder 11 can accurately adjust the concentration of slurries being prepared.

The liquid level sensors 30*a* and 30*b* are also utilized to calculate the residual amounts of stock solutions 15 and 16 in the first and second stock solution tanks 13 and 14, respectively. That is, the initial amounts of stock solutions 15 and 16 stored in the first and second stock solution tanks 13 and 14 are known, and consumption of each stock solution 15 (16) is calculated based on the detection signal from the liquid level sensor 30*a* (30*b*) and the cycles of slurry preparation. Accordingly, the current residual amount of stock solution 15 (16) can be calculated by deducting the feed amount from the initial amount of stock solution 15 (16).

The residual amounts of stock solutions 15 and 16 thus calculated are useful for determining when the stock solution tanks 13 and 14 need to be replaced or refilled. That is, the slurry feeder 11 displays a message suggesting preparation for replacement of the stock solution tanks 13 and 14, when the amounts of stock solutions 15 and 16 decrease to predetermined levels. The slurry feeder 11 also displays a message requiring replacement of the first and second stock solution tanks 13 and 14, when the stock solutions 15 and 16 are used up. Thus, the slurry feeder 11 prevents down time due to absence of stock solutions 15 and 16.

Referring again to FIG. 1, a main circulating pipe 31 is connected to the first and second mixing tanks 12*a* and 12*b*. The slurries 17 prepared in the tanks 12*a* and 12*b* are circulated through the main circulating pipe 31 by a first pump 32*a* and a second pump 32*b* interposed between the tanks 12*a* and 12*b* and the main circulating pipe 31, respectively. The circulation of the slurries 17 prevents the slurries 17 from dwelling and aggregating.

Branch pipes 105*a* and 105*b* connected to the main circulating pipe 31 for supplying the slurry 17 to the CMP units 18*a* and 18*b*. The branch pipes 105*a* and 105*b* are connected to nozzles provided in the CMP units 18*a* and 18*b* respectively. The branch pipes 105*a* and 105*b* have supply valves 33*a* and 33*b* respectively. The slurry 17 circulated is supplied from the main circulating pipe 31 through the branch pipes 105*a* and 105*b* to the CMP units 18*a* and 18*b* under operation of the respective supply valves 33*a* and 33*b*.

Reduced sections 106 are provided at the junctions of the main circulating pipe 31 with the branch pipes 105*a* and 105*b*. As shown in FIG. 10, the reduced sections 106 each comprise a first flow control valve 107 attached to the main circulating pipe 31 and a flow dividing pipe 109 connecting a second flow control valve 108 parallel to the valve 107. The branch pipes 105*a* and 105*b* are connected to the flow dividing pipe 109.

The reduced sections 106 control the flow rates of the slurries 17 flowing through the branch pipes 105*a* and 105*b* and preferably maintain the flow rates at fixed levels. Thus, a fixed amount of slurry 17 is supplied to the CMP units 18*a* and 18*b* independent of use conditions. For example, when the supply valve 33*b* located on the upstream side of the CMP unit 18*b* is opened, while the slurry 17 is being supplied to the CMP unit 18*a*, to start supply of the slurry 17 to the CMP unit 18*b*, the amount of slurry 17 supplied to the CMP unit 18*a* decreases. This makes the polishing treatment in the CMP units 18*a* and 18*b* unstable. Accordingly, the amounts of slurry 17 to be supplied to the branch pipes 105*a* and 105*b* are maintained constantly at a fixed level by the presence of the reduced sections 106, stabilizing the polishing treatment in the CMP units 18*a* and 18*b*.

The slurry feeder 11 also includes a first sub-circulating pipe 34*a* and a second sub-circulating pipe 34*b*, parallel to the main circulating pipe 31, which are connected to the first and second mixing tanks 12*a* and 12*b* respectively. First selector valves 35*a* and 35*b* are interposed between the first and second sub-circulating pipes 34*a* and 34*b* and the first and second pumps 32*a* and 32*b*, respectively, and second selector valves 36*a* and 36*b* are interposed between the first and second sub-circulating pipes 34*a* and 34*b* and the first and second mixing tanks 12*a* and 12*b*, respectively.

The first selector valves 35*a* and 35*b* are provided to switch the passage of the circulating slurry 17 between the main circulating pipe 31 and the first and second sub-circulating pipes 34*a* and 34*b*. More specifically, the slurry feeder 11 circulates the slurry 17 through the main circulating pipe 31 or through the first and second sub-circulating pipes 34a and 34b by operating the first and second selector valves 35a, 35b, 36a and 36b.

An inert gas, such as Nitrogen gas, is supplied to the first and second mixing tanks 12a and 12b through pipes having discharge valves 37a and 37b, respectively. The inert gas inhibits deterioration of the slurries 17 in the first and second mixing tanks 12a and 12b. When the surface of a chemical such as the slurry 17 is brought into contact with air, the surface portion of the chemical reacts with the air and undergoes changes in its composition, concentration, etc. For example, nitric acid contained in the slurry 17 reacts with air to be oxidized, and thus the composition of the slurry 17 is changed However, the slurry feeder 11 determines gain or loss in the amounts of slurries 17 in the first and second mixing tanks 12a and 12b based on detection signals from the liquid level sensors 30a and 30b, respectively. The slurry feeder 11 then controls the volumes of the inert gas in the first and second mixing tanks 12a and 12b depending on the gain or loss. In other words, the slurry feeder 11 supplies such inert gas to the first and second mixing tanks 12a and 12b when the amounts of slurries 17 are reduced to prevent nitric acid from being brought into contact with air thus avoiding changes in the composition of the slurries 17.

Further, the nitrogen gas is supplied to discharge water used for flushing the inside of the first and second mixing tanks 12a and 12b. More specifically, the pure water supplied to the mixing tanks 12a and 12b through the nozzles 27a and 27b, as described above, is discharged through pipes having drain valves 38a and 38b and sensors 39a and 39b, respectively. The sensors 39a and 39b are preferably capacitance sensors and are provided to detect presence or absence of waste water, i.e. completion of discharge of the pure water from the mixing tanks 12a, 12b.

Further, the first and second mixing tanks 12a and 12b are provided with level sensors 40a and 40b respectively. The level sensors 40a and 40b are attached to the bottoms of the first and second mixing tanks 12a and 12b to transmit ultrasonic waves to the slurries 17 in the tanks 12a and 13b, respectively. The level sensors 40a and 40b measure the amounts of abrasive grains deposited in the first and second mixing tanks 12a and 12b by measuring the difference in the intensity of the ultrasonic waves reflected from the inside of the mixing tanks 12a and 12b.

Ultrasonic waves are propagated at a rate corresponding to the density of a substance. Accordingly, the intensity of the reflected wave is high where there is a great difference in the density. The amount of the abrasive grains deposited determined by measuring the time until such high-intensity reflection is obtained. Upon detection of deposition of the abrasive grains, the slurry feeder 11 drains he mixing tanks 12a and 12b and provides an alarm requiring flushing of the CMP units 18a and 18b. Thus, the abrasive grains are prevented from being fed to the CMP units 18a and 18b, thereby preventing scratches on the wafers undergoing polishing treatment.

Figure 2:
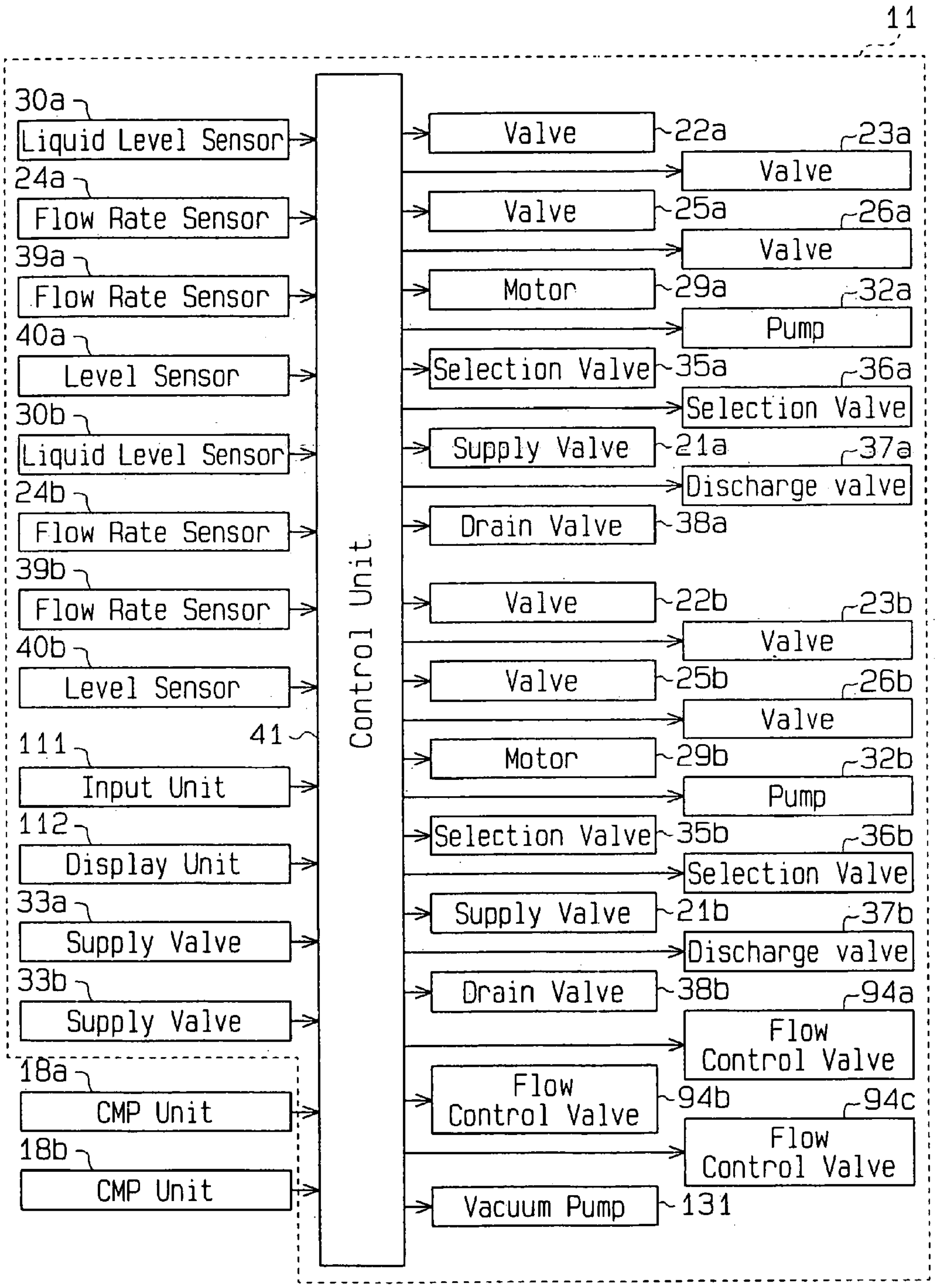
FIG. 2 is a block diagram showing an electrical structure of the slurry feeder of FIG. 1.

The slurry feeder 11 includes a control unit 41 which manages the operation of the slurry feeder 11. Referring to FIG. 2, the sensors 24a, 30a, 39a, 40a, the valves 22a, 23a, 25a, the supply valves 21a, the selector valve 36a and the drain valve 38a associated with the first mixing tank 12a are connected to the control unit 41. Further, the sensors 24b, 30b, 39b, 40b, the valves 22b, 23b, 25b, the supply valves 21b, the selector valve 36b and the drain valve 38b associated with the second mixing tank 12b are connected to the control unit 41. The flow control valves 94a to 94c for controlling the flow rates of the stock solutions 15 and 16 and of the pure water supplied to the mixing tanks 12a and 12b, and the supply valves 33a and 33b for supplying the slurries 17 to the CMP units 18a, 18b are also connected to the control unit 41.

Further, an input unit 111 and a display unit 112 are connected to the control unit 41. The input unit 111 is utilized for inputting information into the control unit 41 such as the contents of the stock solution tanks 13 and 14, composition of the slurry 17 to be prepared (amounts of stock solutions to be mixed), etc. The display unit 112 is utilized for displaying the processing state of the slurry feeder 11, the expected timing of replacing the stock solution tanks 13 and 14, based on the contents of the tanks 13 and 14 and to tell on operator other related information. For instance, the display unit 112 can also inform the operator if a valve is defective or nonfunctional, as sell as whatever the valve is opened or closed. The input unit 111 and the display unit 112 may comprise a single or integral unit.

The CMP units 18a and 18b are also connected to the control unit 41. The CMP units 18a and 18b output command signals based on the processing conditions, including the number of wafers to be processed etc. The control unit 41 calculates the timing of forming another batch of slurry 17 and the amount of slurry 17 to be prepared based on the input command signals and the residual amount of slurry 17.

The control unit 41 is further provided with a memory (not shown). Control program code and data for the slurry feeder 11 are stored in the memory.

Figure 3:
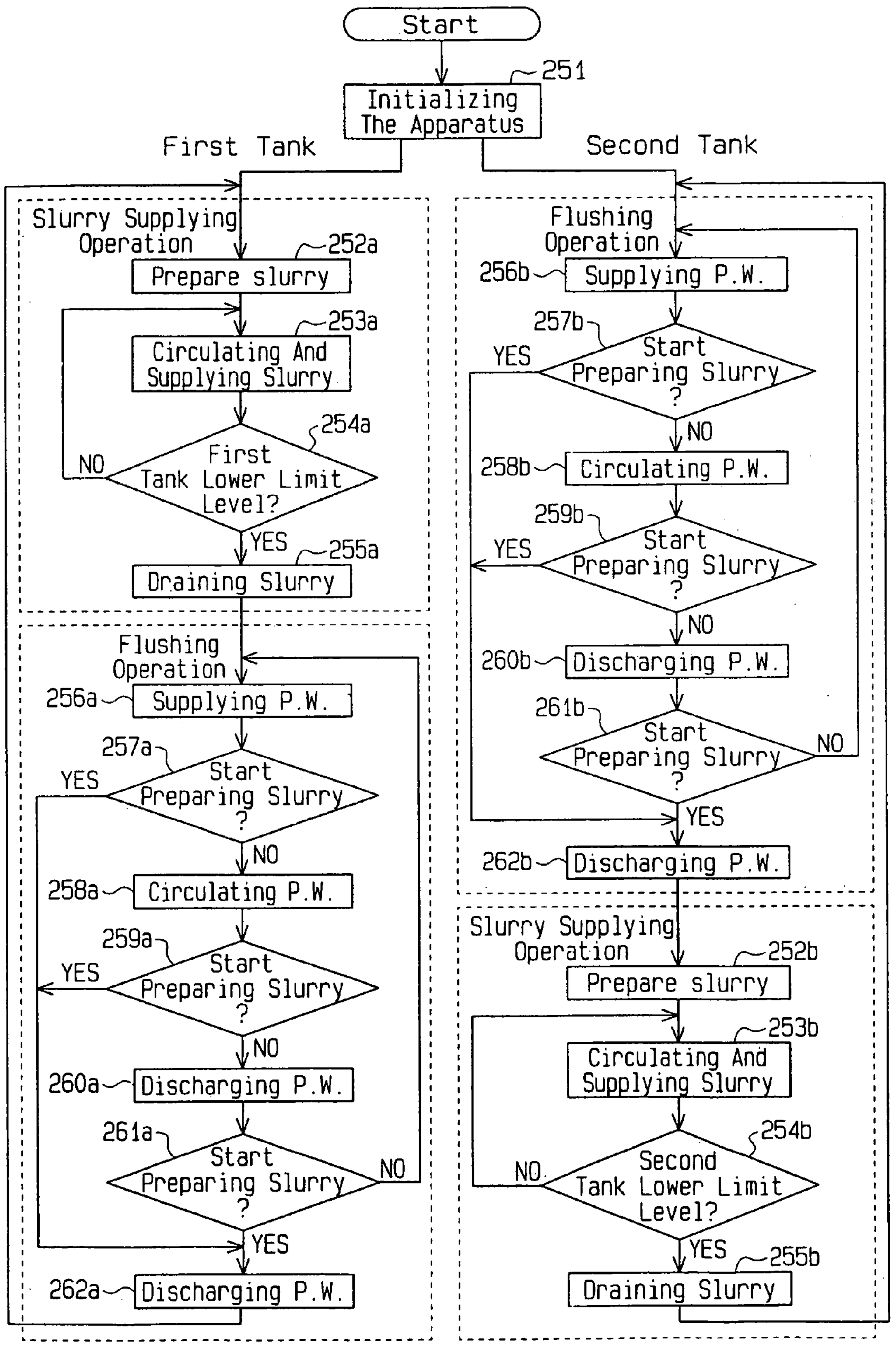
FIG. 3 is a flow chart showing operations of the slurry feeder of FIG. 1.

The control program data contain processing program data for executing a slurry supplying operation, shown in FIG. 3.

The control unit memory includes data for calculating the amount of slurry 17 to be prepared and the timing of starting preparation of a new batch of slurry 17. In the CMP units 18a and 18b, processing information including the number of wafers to be processed, required flow rate of the slurry 17 (delivery of the slurry 17 to be injected from the nozzles of the CMP units 18a and 18b), etc., prestored before processing is started. The control unit 41 receives processing information from the CMP units 18a and 18b and prestores this information as part of the initialization step 251. The control unit 41 calculates the timing of preparing a new batch and the amount of slurry 17 to be prepared based on prestored the processing information sensor data, and the residual amount of slurry 17 in the mixing tank 12a or 12b.

The control unit 41 first calculates the residual amount of slurry in the mixing tank 12a or 12b based on the detection signal from the liquid level sensor 30a or 30b. The control unit 41 also calculates consumption of slurry 17 necessary for processing the wafers based on the number of wafers and flow rate included in the prestored processing information. The control unit 41 then calculates the amount of slurry 17 to be prepared next based on the consumption of slurry 17 and the residual amount of slurry 17 in the first or second mixing tank 12a and 12b.

Next, the control unit 41 calculates the timing of carrying out switching from one mixing tank 12a or 12b to the other mixing tank 12b or 12a based on the residual amount of slurry 17 in one tank 12a or 12b and the flow rate of slurry 17 used in the CMP units 18a and 18b. The switch timing is determined by dividing the residual amount of slurry 17 in the tank 12a or 12b by the flow rate of the slurry 17. The control unit 41 then calculates the timing of starting preparation of another batch of slurry 17 based on the calculated switch timing and also taking the time necessary for preparing the slurry 17 into consideration. The slurry preparation start timing is set such that preparation of a new batch may be completed in one mixing tank 12*a* or 12*b* when most of the slurry 17 in the other tank 12*b* or 12*a* is consumed. In the first embodiment, preparation of a new batch is started at an earlier time of the residual amount of slurry 17 being supplied decreases to the preset preparation start level.

Alternatively, the control unit 41 could set the slurry preparation start timing based only on the residual amount of slurry 17 in the mixing tank 12*a* or 12*b* irrespective of the flow rate of the slurry 17. This method is simple, since it only requires monitoring the residual amount of slurry in the mixing tank 12*a* or 12*b*. When the residual amount in the tank 12*a* or 12*b* decreases to the preparation start level, preparation of a new batch is started. However, according to this method, if the preparation start level is preset at allow level, preparation of a new batch of slurry 17 may start too late for efficient operation.

On the other hand, if the preparation start level is set at a high level, preparation of a new batch of slurry 17 starts too soon, allowing the slurry 17 to sit or remain idle in the tank prior to use. For such reasons, the timing of staring preparation of a new batch is calculated based on the residual amount of slurry 17 in the first or second mixing tanks 12*a* or 12*b* and on the processing information of the CMP units 18*a* and 18*b*. Thus, preparation of a new batch is completed just when the slurry 17 in one tank 12*a* or 12*b* is used up, enabling continuous and successive supply of the slurry 17 and preventing unnecessary storage of the slurry 17 in one of the mixing tanks 12*a*, 12*b*.

Further, the control unit 41 calculates the residual amounts of stock solutions 15 and 16 in the stock solution tanks 13 and 14 respectively. The control unit 41 stores in its memory the initial amounts of stock solutions 15 and 16. The control unit 41 also supplies predetermined amounts of stock solutions 15 and 16 to the first or second mixing tanks 12*a* or 12*b* based on a detection signal from the liquid level sensor 30*a* or 30*b*. The control unit 41 calculates consumption of the stock solutions 15 and 16 based on the feed amounts and the cycles of slurry preparation. The control unit 41 deducts the consumption from the supply amount to determine the residual amount in each stock solution tank 13, 14.

When the calculated residual amount decreases to a preset level, the control unit 41 displays on the display unit 112 a message requiring replacement of the stock solution tank 13 or 14. The present invention thus prevents running out of stock solutions 15 and 16.

Figure 5:
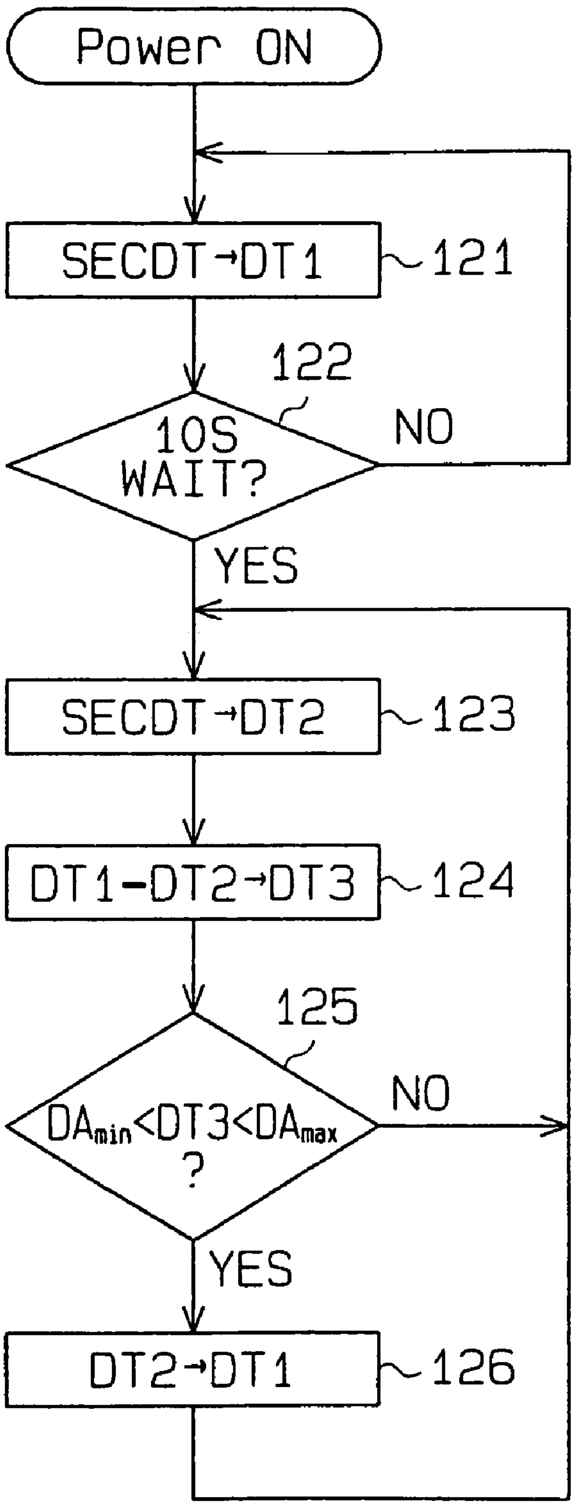
FIG. 5 is a flow chart showing filter treatment for detecting liquid levels.

Further, the control unit 41 performs filter treatment, as shown in FIG. 5. The filter treatment is carried out to stabilize the slurry supplying operation.

The flow chart in FIG. 5 starts from energization of the control unit 41. The control unit 41 executes steps 121 to 126 upon energization.

First, in step 121, the control unit 41 receives the detection signals from the liquid level sensors 30*a* and 30*b*, and calculates the current liquid level data SECDT based on the detection signals and then stores SECDT in a first level data DT1.

In step 122, the control unit 41 determines whether a predetermined time (e.g., 10 seconds) has elapsed after energization. If the predetermined time has not elapsed, the control unit 41 returns to the process to step 121. The control unit 41 executes steps 121 and 122 repeatedly until the predetermined time elapses. Such repeated procedures are carried out to wait for stabilization of equipment including the liquid level sensors 30*a* and 30*b*, amplifiers and the like. If the amplifiers etc. are not stabilized, accurate detection signals cannot be obtained, and the detected liquid levels may contain errors. The procedures of steps 121 and 122 are incorporated to avoid only such detection errors.

After passage of the predetermined period, the control unit 41 proceeds to step 123. In step 123, the control unit 41 again receives the detection signals from the liquid level sensors 30*a* and 30*b* and calculates the current liquid level data SECDT based on the detection signals and stores SECDT in a second level data DT2.

Next, in step 124, the control unit 41 calculates the difference between the first level data DT1 and the second level data DT2 and stores the result in a third level data DT3. In step 125, the control unit 41 determines whether the third level data DT3 is within a preset range (DAmin to DAmax).

The amounts of liquids to be supplied to the first and second mixing tanks 12*a* and 12*b*, which are determined beforehand depending on the consumption of the slurry 17 are set as values DAmin and DAmax specifying a range. For example, the minimum value DAmin is set to be smaller than the flow rate of the slurry 17, whereas the maximum value DAmax is set to be greater than the amount of liquid. When the values DAmin and DAmax specifying the range are set, rippling on the liquid surface and external noise are taken into consideration.

When the third level data DT3 is not within the range specified above, the control unit 41 returns to step 123 and calculates liquid level data SECDT based on detection signals input in a next cycle and stores the new SECDT data in the second level data DT2.

When the third level data DT3 is within the specified range, the control unit 41 updates the first level data DT1 with the second level data DT2 in step 126.

More specifically, the control unit 41 determines that the second level data DT2 showing the liquid level is valid when the third level data DT3 is within the specified range, and that it is invalid when DT3 is not within the specified range. The control unit 41 then executes the procedures based on the valid second level data DT2, which removes influences of detection signals detecting rippling on the liquid surface caused by each procedure, external noise, etc. That is, when the third level data DT3 is not less than an estimated displacement value the control unit 41 cancels the third level data DT3. Thus, the control unit 41 can stably detect the liquid levels in the first and second mixing tanks 12*a* and 12*b*.

Operation of the slurry feeder 11 will now be described referring to the flow chart shown in FIG. 3. First, in step 251, the control unit 41 performs initialization of the entire system. After completion of the initialization, the control unit 41 executes steps 252*a* to 262*a* with respect to the first mixing tank 12*a* and steps 252*b* to 262*b* with respect to the second mixing tank 12*b* in parallel.

Steps 252*a* to 255*a* are procedures of slurry supplying operation with respect to the first mixing tank 12*a*, while steps 256*a* to 262*a* are procedures of flushing operation with respect to the first mixing tank 12*a*. Steps 252*b* to 255*b* are procedures of slurry supplying operation with respect to the second mixing tank 12*b*, while steps 256*b* to 262*b* are procedures of flushing operation with respect to the second mixing tank 12*b*.

The procedures of slurry supplying operation with respect to the first mixing tank 12*a* will be described first in detail. It should be noted here that the procedures described below are usually performed when the slurry 17 prepared in the second mixing tank 12*b* is being supplied to the CMP units 18*a* and 18*b*.

The control unit 41 calculates the residual amount of slurry 17 at strategic time points in the second mixing tank

12*b* based on detection signals output from the liquid level sensor 30*b*. The control unit 41 executes step 252*a* after reduction of the residual amount of slurry 17 in the second mixing tank 12*b* to the predetermined preparation start level or at the preset preparation start timing.

In step 252*a*, to prepare a slurry 17, the control unit 41 supplies predetermined amounts of the first and second stock solutions 15 and 16 from the first and second stock solution tanks 13 and 14 to the first mixing tank 12*a*. More specifically, the control unit 41 first closes the drain valve 38*a* and opens the supply valve 21*a* and the valve 22*a*. The control unit 41 supplies nitrogen gas to the first stock solution tank 13 to force-feed the first stock solution 15 to the first mixing tank 12*a* under the pressure of the nitrogen gas. When the level of the first stock solution 15 supplied to the first mixing tank 12*a* approaches a predetermined level, the control unit 41 controls the opening of the flow control valve 94*a* based on a detection signal from the liquid level sensor 30*a* to slow down supply of the first stock solution 15. Further, the control unit 41 closes the supply valve 21*a* and the valve 22*a* to stop supply of the first stock solution 15, when the control unit 41 determines that the desired amount of the first stock solution 15 has been provided to the first mixing tank 12*a*, based on a detection signal from the liquid level sensor 30*a*.

Next, the control unit 41 opens the supply valve 21*b* and the valve 23*a* to supply nitrogen gas to the second stock solution tank 14 and force-feed the second stock solution 16 to the first mixing tank 12*a* under the pressure of the nitrogen gas. When the level of the second stock solution 16 supplied to the first mixing tank 12*a* approaches a predetermined level, the control unit 41 controls the opening of the flow control valve 94*b* based on a detection signal from the liquid level sensor 30*a* to slow down the supply of the second stock solution 16. Further, the control unit 41 closes the supply valve 21*b* and the valve 23*a* to stop supply of the second stock solution 16, when the control unit 41 determines that the desired amount of the second stock solution 16 has been provided to the first mixing tank 12*a* based on a detection signal from the liquid level sensor 30*a*.

Further, the control unit 41 opens the valve 25*a* to supply pure water to the mixing tank 12*a*. The control unit 41 then drives the motor 29*a* to rotate the stirrer 28*a* and mix the first and second stock solutions 15, 16 and the pure water. When the level of the pure water approaches a necessary level, the control unit 41 then controls the opening of the flow control valve 94*c* based on a detection signal from the liquid level sensor 30*a* to slow down the supply of the pure water. Further, the control unit 41 closes the valve 25*a* to stop supply of the pure water, when the control unit 41 determines that the liquid level in the first mixing tank 12*a* is at the desired level based on a detection signal from the liquid level sensor 30*a*.

The control unit 41 supplies accurately the first and second stock solutions 15 and 16 and pure water in predetermined amounts to the first mixing tank 12*a* through the steps described above. Further, the control unit 41 prepares a slurry 17 by mixing the first and second stock solutions 15 and 16 and pure water. The control unit 41 proceeds from step 252*a* to step 253*a*.

In step 253*a*, which is a slurry circulating procedure, the control unit 41 switches the selector valves 35*a* and 36*a* to the first sub-circulating pipe 34*a* to circulate the slurry 17. Thus, the slurry 17 is prevented from sitting in the tank 12*a* so that the abrasive grains in the slurry 17 do not precipitate.

It should be noted here that when the residual amount of slurry 17 in the second mixing tank 12*b* decreases to the lower limit, the control unit 41 detects that the slurry 17 in the second mixing tank 12*b* is substantially used up. The control unit 41 then controls the selector valves 35*a*, 35*b*, 36*a* and 36*b* to switch the passage for circulating the slurry 17 prepared in the first mixing tank 12*a* to the main circulating pipe 31. Thus, the control unit 41 supplies the slurry 17 in the first mixing tank 12*a* through the main circulating pipe 31 to the CMP units 18*a* and 18*b*.

In step 255*a*, the control unit 41 determines whether the liquid level of the slurry 17 in the first mixing tank 12*a* has decreased to the lower level or not (i.e. whether the slurry 17 is substantially used up or not). If there is still a sufficient amount of slurry 17 in the tank 12*a*, the control unit 41 returns to step 253 and continues supplying the slurry 17. On the other hand, if the level of the slurry 17 left in the first mixing tank 12*a* decreases to the lower limit, the control unit 41 proceeds to step 255*a*.

In step 255*a*, the control unit 41 controls the selector valves 35*a*, 35*b*, 36*a* and 36*b* to circulate the slurry 17 prepared in the second mixing tank 12*b* through the main circulating pipe 31 and supply the slurry 17 in the tank 12*b* to the CMP units 18*a* and 18*b*. The control unit 41 stops the first pump 32 for the first mixing tank 12*a*. The control unit 41 also discharges the residue of the slurry 17 in the first mixing tank 12*a*. More specifically, the control unit 41 operates the tank discharge valve 37*a* to supply high-pressure nitrogen gas into the first mixing tank 12*a* and also opens the drain valve 38*a*. Thus, the residue of the slurry 17 in the first mixing tank 12*a* is discharged forcibly therefrom under the pressure of the nitrogen gas. Accordingly, there remains no old slurry 17 in the first mixing tank 12*a*.

When the slurry 17 in the first mixing tank 12*a* is discharged thoroughly, the control unit 41 closes the discharge valve 37*a* and the drain valve 38*a* to complete the slurry supplying operation. Further, the control unit 41 proceeds to step 256*a* to start flushing operation.

Next, the flushing operation with respect to the first mixing tank 12*a* will be described in detail.

In step 256*a*, the control unit 41 first opens the valve 26*a* to spray pure water through the nozzle 27*a* into the first mixing tank 12*a* to wash off the slurry 17 remaining on the inner wall surface of the first mixing tank 12*a*. Next, the control unit 41 opens the valve 25*a* to feed pure water into the first mixing tank 12*a*. When a predetermined amount of pure water is supplied to the first mixing tank 12*a*, the control unit 41 closes the valves 25*a* and 26*a* to stop spraying and feeding the pure water and proceeds to step 257*a*.

In step 257*a*, the control unit 41 determines whether or not preparation of a new batch of slurry should be started in the first mixing tank 12*a*. That is, the control unit 41 determines whether the residual amount of slurry 17 in the second mixing tank 12*b* has dropped to the preparation start level or whether the preset preparation start timing has occurred. If the control unit 41 determines that it is time to start preparation of a new batch, the control unit 41 proceeds to step 262*a*. If the control unit 41 determines that it is not time, the control unit 41 proceeds to step 258*a*.

In step 258*a*, which is a pure water circulating procedure, the control unit 41 effects stirring of the pure water in the first mixing tank 12*a* by rotating the stirrer 28*a* by driving the motor 29*a*. Further, the control unit 41 switches the selector valves 35*a* and 36*a* to the first subcirculating pipe 34*a* and drives the first pump 32*a* to circulate the pure water through first sub-circulating pipe 34*a*. Thus, the slurry 17 remaining in the first sub-circulating pipe 34*a* and the first pump 32*a* is washed therefrom. After passage of a predetermined time from the circulation of the pure water through the first sub-circulating pipe 34*a* the control unit 41 stops the motor 29*a* and the first pump 32*a* to stop circulation of the pure water and proceeds to step 259*a*.

In step 259*a*, which is the same as step 257*a*, the control unit 41 proceeds to step 262*a* when it is time to prepare a new batch of the slurry. The control unit 41 proceeds to step 260*a* when it is not time to prepare a new batch of the slurry.

In step 260*a*, which is a pure water discharging procedure, the control unit 41 operates the discharge valve 37*a* to supply high-pressure nitrogen gas into the first mixing tank 12*a* and also opens the drain valve 38*a*. Thus, the pure water used to carry out flushing of the inside of the first mixing tank 12*a* is discharged therefrom forcibly under the pressure of the nitrogen gas. When the pure water is discharged completely, the control unit 41 closes the discharge valve 37*a* and the drain valve 38*a* and proceeds to step 261*a*.

In step 261*a*, which is the same procedure as in steps 257*a* and 259*a*, the control unit 41 proceeds to step 262*a* when it is time to prepare a new batch of slurry. When it is not time to prepare a new batch of slurry, the control unit 41 proceeds to step 260*a* to carry out flushing of the inside of the mixing tank 12*a* again.

In step 262*a*, subsequent to step 257*a*, 259*a* or 261*a*, the control unit 41 discharges the pure water in the first mixing tank 12*a* to prepare a new batch of slurry 17 therein and returns to step 252*a*.

As described above, the control unit 41 repeats alternately the operation of preparing a slurry 17 and the operation of flushing the first mixing tank 12*a* and the first sub-circulating pipe 34*a* with respect to the tank 12*a*. In these repeated procedures, if the level of the slurry 17 in the first mixing tank 12*a* drops to the lower limit (when the slurry 17 is used up), the control unit 41 discharges forcibly the residue of the slurry 17 in the first mixing tank 12*a* in order to avoid clogging of the circulating passage 34. Further, by repeating the procedures in steps 256*a* to 261*a* with respect to the first mixing tank 12*a*, the control unit 41 achieves flushing of the tank 12*a* and the first sub-circulating pipe 34*a* by circulation of pure water therethrough. When it is time to start preparation of a new batch in the first mixing tank 12*a*, the flushing treatment is interrupted, and the pure water in the tank 12*a* is discharged.

Next, the procedures of slurry supplying operation with respect to the second mixing tank 12*b* and the procedures of flushing operation with respect to the tank 12*b* will be described. It should be noted here that the second mixing tank 12*b* operates in the same manner as the first mixing tank 12*a*. That is, the procedures of steps 252*b* to 255*b* (slurry supplying operation) with respect to the second mixing tank 12*b* correspond to those of steps 252*a* to 255*a* with respect to the first mixing tank 12*a*.

Further, the procedures of steps 256*b* to 262*b* (flushing operation) with respect to the second mixing tank 12*b* correspond to those of steps 256*a* to 262*a* with respect to the first mixing tank 12*a*. Therefore, only those cases where both the first mixing tank 12*a* and the second mixing tank 12*b* concern with each other will be described in detail.

Suppose that the slurry 17 in the first mixing tank 12*a* is being supplied to the CMP units 18*a* and 18*b* and that the second mixing tank 12*b* is undergoing flushing operation. The control unit 41 repeats the flushing procedures of steps 256*b* to 261*b* until it is time to start preparation of a new batch in the second mixing tank 12*b*. When the residual amount of slurry 17 in the first mixing tank 12*a* decreases to the preparation start level, or when the preset preparation start timing occurs, the control unit 41 proceeds to step 262*a* and discharges the pure water in the second mixing tank 12*b*.

Then, in step 252*a*, the control unit 41 prepares a new batch of slurry 17. When the residual amount of slurry 17 in the first mixing tank 12*a* drops to the lower limit, or when the slurry 17 is substantially used up, the control unit 41 supplies the slurry 17 prepared in the second mixing tank 12*b* to the CMP units 18*a* and 28*b* in step 253*b*. Further, when the level of the slurry 17 in the second mixing tank 12*b* decreases to the lower limit or when the slurry 17 is substantially used up, the control unit 41 discharges the residue of the slurry 17 in the second mixing tank 12*b* in step 255*b*. In step 255*b*, the slurry 17 in the first mixing tank 12*a* is supplied to the CMP units 18*a* and 18*b*. The control unit 41 then carries out flushing of the second mixing tank 12*b* and the second sub-circulating pipe 34*b* connected thereto in steps 256*b* to 261*b*.

As described above, the control unit 41 supplies continuously and successively the slurries 17 prepared in the tanks 12*a* and 12*b*, employing the tanks 12*a* and 12*b* alternately, to the CMP units 18*a* and 18*b*. Further, the control unit 41 carries out flushing of the first and second mixing tanks 12*a* and 12*b*, as well as, of the first and second sub-circulating pipes 34*a* and 34*b* and the first and second pumps 32*a* and 32*b*, alternately.

However, if the CMP units 18*a* and 18*b* are to be left unused for a long period, the control unit 41 carries out flushing of the main circulating pipe 31 with pure water. That is, the control unit 41 executes flushing of the main circulating pipe 31 after passage of a predetermined time since the CMP units 18*a* and 18*b* are not in operation.

For example, when there is some slurry 17 left in the first mixing tank 12*a*, the control unit 41 circulates the slurry 17 from the first mixing tank 12*a* through the main circulating pipe 31. The control unit 41 also carries out flushing of the second mixing tank 12*b* and the second pump 32*b* which are not in operation by circulating pure water utilizing the sub-circulating pipe 34*b*.

After passage of a predetermined time since supply of the slurry 17 to the CMP units 18*a* and 18*b* has stopped, the control unit 41 first controls switching of the selector valves 35*a* and 36*a* to allow the slurry 17 having been circulated through the main circulating pipe 31 to circulate through the first sub-circulating pipe 34*a*. The control unit 41 then controls the selector valves 35*b* and 36*b* to allow the pure water having been circulated through the second sub-circulating pipe 34*b* to circulate through the main circulating pipe 31. Thus, the main circulating pipe 31 is flushed by the pure water to avoid dwelling of the slurry 17 in the pipe 31, prevent clogging of the pipe 31.

When the CMP units 18*a* and 18*b* are left unused for much longer periods, the control unit 41 transfers the remaining slurry 17 alternately between the first and second mixing tanks 12*a* and 12*b*. The control unit 41 carries out flushing of the first and second mixing tanks 12*a* and 12*b* alternately when they are not in operation.

For example, when some slurry 17 remains in the first mixing tank 12*a*, the control unit 41 controls switching of the selector valves 35*a* and 36*b* to transfer the slurry 17 from the first mixing tank 12*a* to the second mixing tank 12*b* through the main circulating pipe 31. Thus, now that the second mixing tank 12*b* is not in operation, the control unit 41 carries out flushing of the second mixing tank 12*b*.

As described above, the following effects are exhibited according to the slurry feeder 11 of the first embodiment.

Since the slurries 17 are prepared in the mixing tanks 12*a* and 12*b* in only the amounts required in the CMP units 18*a* and 18*b*, there remains no old slurry in the tanks 12*a* and 12*b*. Accordingly, fresh slurries 17 are supplied constantly to the CMP units 18a and 18b. Further, since the slurry feeder 11 has two mixing tanks 12a and 12b, the slurry 17 is supplied continuously and successively to the CMP units 18a and 18b by using the tanks 12a and 12b alternately. Since the control unit 41 allows the slurry 17 prepared to circulate, precipitation is prevented from occurring in the slurry 17.

The control unit 41 is designed to carry out flushing of the slurry circulating passages together with the mixing tank 12a or 12b when the slurry 17 is used up. Accordingly, the flushing cycle is reduced by carrying out flushing of the mixing tank 12a or 12b when it is not in operation, so that sediments removed easily. As a result, dwelling and formation of dry slurry in the mixing tanks 12a and 12b and the slurry circulating passages are prevented from occurring.

(Second Embodiment)

Figure 6:
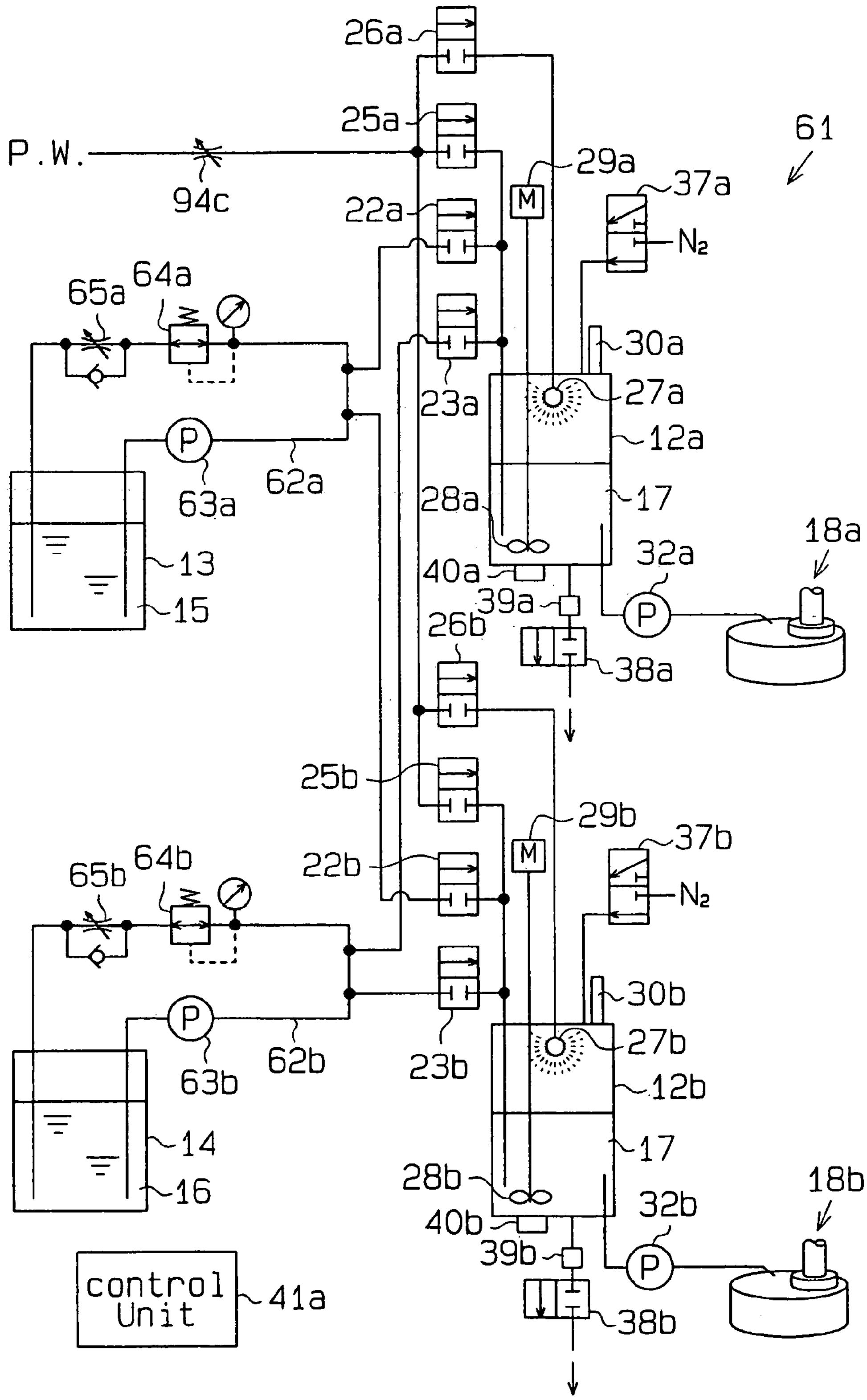
FIG. 6 is a schematic diagram showing a structure of a slurry feeder according to a second embodiment of the present invention.

A second embodiment of the present invention will be described below referring to FIG. 6.

In a slurry feeder 61 of the second embodiment, CMP units 18a, 18b are provided with mixing tanks 12a, 12b for preparing slurries 17 respectively. The first mixing tank 12a and the second mixing tank 12b are preferably disposed proximate to the two CMP units 18a and 18b, respectively. The mixing tanks 12a and 12b each have a sufficient capacity to achieve polishing of a predetermined amount of wafers in the CMP unit 18a or 18b, like in the first embodiment.

The slurry feeder 61 is provided with a control unit 41a. The control unit 41a carries out the slurry supplying operation to prepare a slurry and supply the slurry to the CMP units 18a and 18b the control unit 41a also controls the flushing operation to effect flushing of the first and second mixing tanks 12a and 12b.

In the slurry supplying operation, the control unit 41a supplies stock solutions 15 and 16, stored in a first stock solution tank 13 and a second stock solution tank 14, to the mixing tank 12a and 12b by carrying out metering of the volumes of the stock solutions 15 and 16 based on detection signals from liquid level sensors 30a and 30b provided in the tanks 12a and 12b. The control unit 41a also supplies pure water to the tanks 12a and 12b to dilute the first and second stock solutions and form slurries 17 therein.

The control unit 41a supplies the slurries 17 prepared in the mixing tanks 12a and 12b directly to the CMP units 18a and 18b with the aid of corresponding first and second pumps 32a and 32, respectively. That is, since the slurries 17 are prepared immediately before they are supplied to the CMP units 18a and 18b, fresh slurries 17 supplied constantly to the CMP units 18a and 18b.

The control unit 41a supplies nitrogen gas as an inert gas to the first and second mixing tanks 12a and 12b through pipes having discharge valves 37a and 37b, respectively.

The inert gas inhibits deterioration of the slurries 17 in the first and second mixing tanks 12a and 12b. That is, if the surface of a chemical such as the slurry 17 is brought into contact with air, the surface portion of the chemical reacts with air to undergo changes in the composition, concentration, etc. of the chemical. For example, nitric acid contained in the slurry 17 reacts with air to be oxidized, and thus the composition of the slurry 17 is changed.

Accordingly, the control unit 41a determines gain or loss in the amounts of slurries 17 in the first and second mixing tanks 12a and 12b based on detection signals from the liquid level sensors 30a and 30b, respectively. The control unit 41a then controls the volumes of the inert gas in the first and second mixing tanks 12a and 12b depending on the gain or loss in the amounts of the slurries 17. In other words, the slurry feeder 11 supplies the inert gas to the first and second mixing tanks 12a and 12b when the amounts of slurries 17 are reduced to prevent nitric acid from being brought into contact with air, thus avoiding changes in the composition of the slurries 17.

The control unit 41a carries out draining of slurries from the mixing tanks 12a and 12b to discharge completely the slurries 17 remaining in the tanks 12a and 12b. Further, the control unit 41a carries out flushing of the mixing tanks 12a and 12b so that no old slurry remains in the mixing tanks 12a and 12b, and thus dwelling of slurries is obviated. Preferably, the slurry discharging operation and the flushing operation are the same as those in the first embodiment.

A first circulating pipe 62a and a second circulating pipe 62b are connected respectively to the first and second stock solution tanks 13 and 14. The circulating pipes 62a and 62b are provided with a third pump 63a and a fourth pump 63b, relief valves 64a and 64b and flow control valves 65a and 65b, respectively. The third and fourth pumps 63a and 63b are provided to circulate the stock solutions 15 and 16 through the first and second circulating pipes 62a and 62b, respectively, to prevent occurrence of precipitation in the stock solutions 15 and 16.

The relief valves 64a and 64b and the flow control valves 65a and 65b are provided to maintain the liquid pressures of the stock solutions 15 and 16 being circulated through the circulating pipes 62a and 62b to predetermined levels. The stock solutions 15 and 16 are force-fed by the liquid pressure through the circulating pipes 62a and 62b to the mixing tanks 12a and 12b, respectively, when the control unit 41a opens the valves 22a, 22b, 23a and 23b.

The control unit 41a controls the flow control valves 65a, 65b and 94c so that the flow rates of the first and second stock solutions 15 and 16 and of the pure water may decrease, when the volume thereof supplied to the first and second mixing tanks 12a and 12b approaches predetermined amounts. Thus, the amounts of stock solutions 15, 16 and water in the first and second mixing tanks 12a and 12b are increased slowly, so that it is easy to time the closing of the valves 22a, 23a, 25a, 22b, 23b and 25b. As a result, the amount of each liquid supplied to each mixing tank coincides with the predetermined amount, facilitating preparation of a slurry having an accurate composition.

As described above, according to the first embodiment, since the control unit 41a is adapted to circulate the stock solutions 15 and 16 through the circulating pipes 62a and 62b connected to the stock solution tanks 13 and 14, occurrence of precipitation in the stock solutions 15 and 16 is prevented. Further, a fresh slurry 17 is supplied constantly.

Third Embodiment

Figure 7:
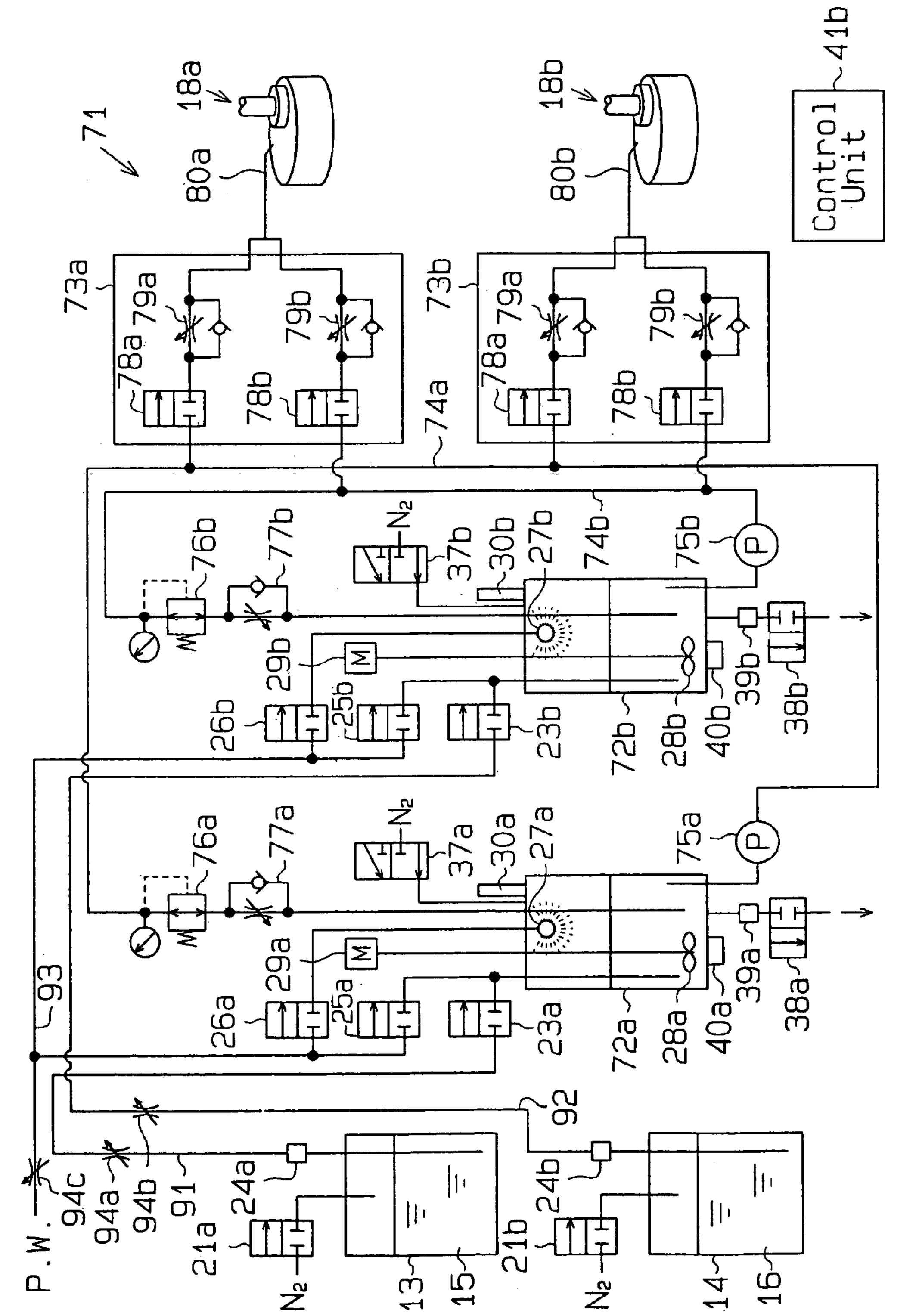
FIG. 7 is a schematic diagram showing a slurry feeder according to a third embodiment of the present invention.

A third embodiment of the present invention will be described below referring to FIG. 7.

In a slurry feeder 71 of the third embodiment, each stock solution tank 13, 14 is connected to a circulating tank 72a, 72b. Further, each CMP unit 18a, 18b is connected to a mixing section 73a, 73b. The slurry feeder 71 also includes a control unit 41b. The control unit 41b controls the slurry preparation and supplying operations to prepare a slurry 17 and supply the slurry 17 to the CMP units 18a and 18b and the flushing operation to effect flushing of the first and second circulating tanks 72a and 72b.

In the slurry supplying operation, the control unit 41b force-feeds a predetermined amount of the first stock solution 15 from the first stock solution tank 13 to the first circulating tank 72a by carrying out metering of the volume of the first stock solution 15 based on a detection signal from a liquid level sensor 30*a*. The control unit 41*b* also force-feeds a predetermined amount of the second stock solution 16 from the second stock solution tank 14 to the second circulating tank 72*b* by carrying out metering of the volume of the, second stock solution 16 based on a detection signal from a liquid level sensor 30*b*.

The amounts of the first and second stock solutions 15 and 16 supplied to the first and second circulating tanks 72*a* and 72*b* respectively are preset to such levels that are necessary to, achieve polishing of a predetermined number of wafers in the CMP units 18*a* and 18*b*. That is, the control unit 41*b* force-feeds the first and second stock solutions 15 and 16 to the first and second circulating tanks 72*a* and 72*b* in amounts required by the CMP units 18*a* and 18*b*.

Further, the control unit 41*b* supplies predetermined amounts of pure water to the first and second circulating tanks 72*a* and 72*b* to dilute the stock solutions 15 and 16 in the circulating tanks 72*a* and 72*b*. The control unit 41*b* also controls driving of motors 29*a* and 29*b* to rotate stirrers 28*a* and 28*b* provided in the circulating tanks 72*a* and 72*b* respectively to stir the diluted stock solutions 15 and 16, preventing precipitation thereof.

The first and second circulating tanks 72*a* and 72*b* are connected to a first circulating pipe 74*a* and a second circulating pipe 74*b* respectively. The circulating pipes 74*a* and 74*b* have pumps 75*a* and 75*b*, relief valves 76*a* and 76*b* and metering valves 77*a* and 77*b*, respectively. The control unit 41 drives the pumps 75*a* and 75*b* to circulate the stock solutions 15 and 16 in the circulating tanks 72*a* and 72*b* through the first and second circulating pipes 74*a* and 74*b*, respectively to prevent precipitation of the stock solutions 15 and 16 in the circulating tanks 72*a* and 72*b*.

The relief valves 76*a* and 76*b* and the metering valves 77*a* and 77*b* are provided to maintain the liquid pressures of the stock solutions 15 and 16 being circulated through the circulating pipes 74*a* and 74*b* to predetermined levels, respectively. The stock solutions in the circulating pipes 74*a* and 74*b* are force-fed by the liquid pressure to the first and second mixing sections 73*a* and 73*b*, respectively.

The first and second mixing sections 73*a* and 73*b* have valves (a first valve 78*a* and a second valve 78*b*) and metering valves 79*a* and 79*b*, respectively. The control unit 41*b* controls opening and closing of the first and second valves 78*a* and 78*b* of the mixing sections 73*a* and 73*b*, simultaneously. When the first and second valves 78*a* and 78*b* are opened simultaneously, the first and second stock solutions 15 and 16 circulating through the first and second circulating pipes 74*a* and 74*b* are force-fed to nozzles 80*a* and 80*b* provided in the CMP units 18*a* and 18*b* through the first and second flow control valves 79*a* and 79*b*, respectively. The nozzles 80*a* and 80*b* preferably contain spiral grooves through which the first and second stock solutions 15 and 16 are mixed and the resulting mixed stock solution is supplied onto tables in the CMP units 18*a* and 18*b*.

The control unit 41*b* also supplies an inert gas, such as nitrogen gas to the first and second circulating tanks 72*a* and 72*b* through pipes having discharge valves 37*a* and 37*b*, respectively.

The inert gas inhibits deterioration of the stock solutions 15 and 16 in the first and second circulating tanks 72*a* and 72*b*. Accordingly, the control unit 41*b* determines gain or loss in the amounts of stock solutions. 15 and 16 in the first and second circulating tanks 72*a* and 72*b* based on detection signals from the liquid level sensors 30*a* and 30*b*, respectively. The slurry feeder 71 then controls the volumes of the inert gas in the first and second circulating tanks 72*a* and 72*b* depending on the gain or loss in the amounts of the stock solutions 15 and 16 determined. In other words, the slurry feeder 71 supplies the inert gas to the first and second circulating tanks 72*a* and 72*b* when the amounts of stock solutions 15 and 16 decrease, thus avoiding changes in the compositions of the stock solutions 15 and 16 in the first and second circulating tanks 72*a* and 72*b*.

The control unit 41*b* also carries out draining of slurries from the circulating tanks 72*a* and 72*b* to discharge completely the slurries 17 remaining in the tanks 72*a* and 72*b*. Further, the control unit 41*b* carries out flushing of the circulating tanks 72*a* and 72*b*, circulating pipes 74*a* and 74*b* and pumps 75 and 75*b*. Thus, no residual slurry remains in the circulating tanks 72*a* and 72*b*, and dwelling of slurries is obviated. Further, flushing the circulating tank 72*a* or 72*b* when it is out of operation allows sediments to be removed easily. Since the slurry discharging operation and the flushing operation are the same as those for the mixing tanks 12*a* and 12*b* in the first embodiment, description of them will be omitted.

As described above, according to the third embodiment, the stock solutions 15 and 16 are fed to the circulating tanks 72*a* and 72*b* only in amounts corresponding to the amount of slurry to be consumed for treating one lot of semiconductor devices in the CMP units 18*a* and 18*b*, and the stock solutions 15 and 16 are circulated by the circulating tanks 72*a* and 72*b*. Thus, not only precipitation in the stock solutions 15 and 16 but also dwelling is avoided.

Further, the nozzles 80*a* and 80*b* contain spiral grooves for mixing the stock solutions 15 and 16 to be supplied. Since the stock solutions 15 and 16 are diluted and mixed immediately before they are supplied to the CMP units 18*a* and 18*b*, there remains no old slurry, and fresh slurries are supplied constantly to the CMP units 18*a* and 18*b*.

It should be apparent to those skilled in the art that the present invention may be embodied in many other specific forms without departing from the spirit or scope of the invention. Particularly, it should be understood that the invention may be embodied in the following forms.

Although Nitrogen gas is employed for force-feeding the stock solutions 15 and 16 in the first and second stock solution tanks 13 and 14 to the first and second mixing tanks 12*a* and 12*b*, the stock solutions 15 and 16 may be supplied to the first and second mixing tanks 12*a* and 12*b* by other methods or structure.

Figure 8:
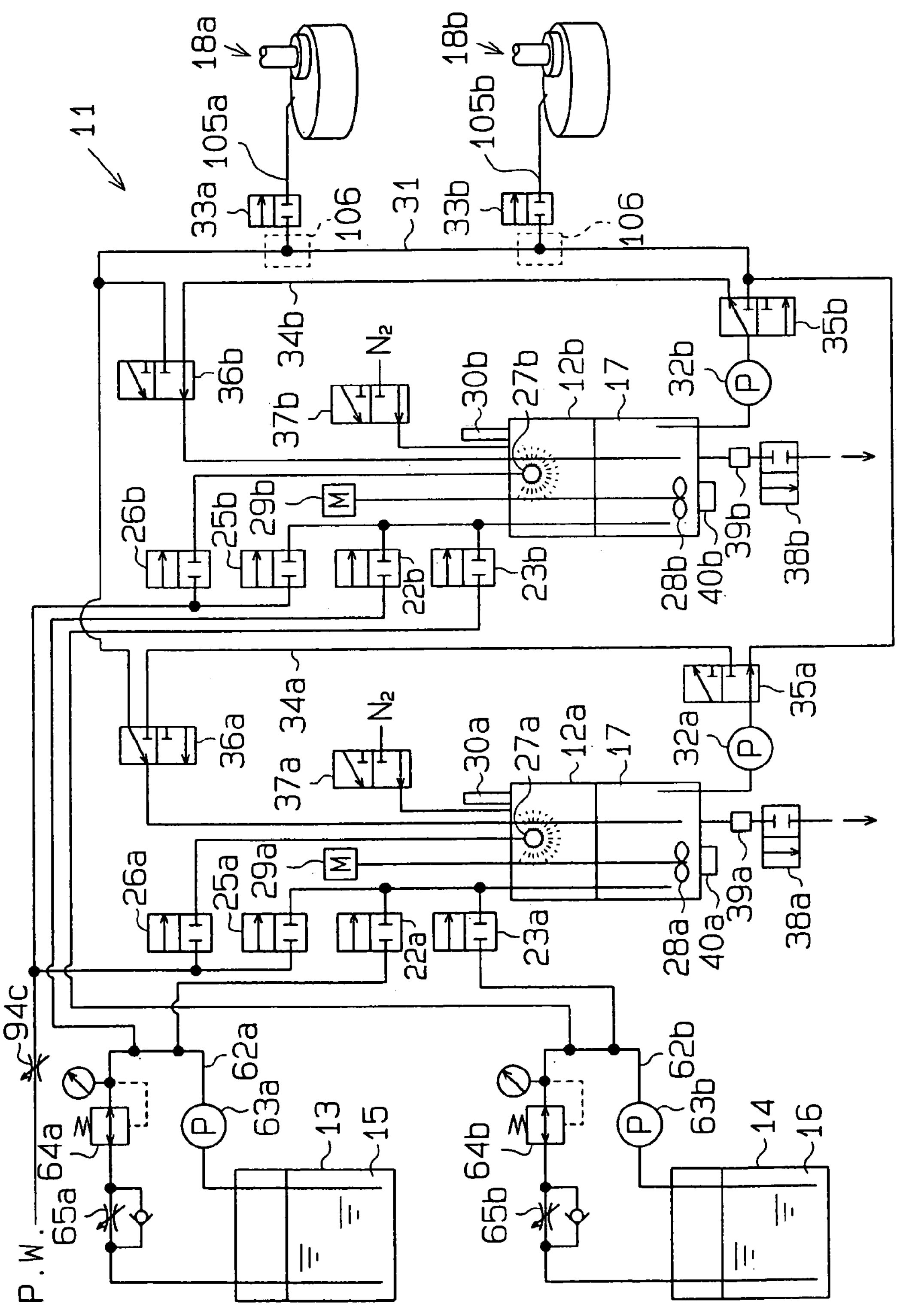
FIG. 8 is a schematic diagram showing a fourth embodiment of a slurry feeder of the present invention.

For example, referring to FIG. 8, the first and second circulating pipes 62*a* and 62*b* employed in the second embodiment may be connected to the first and second stock solution tanks 13 and 14, respectively. In this case, the stock solutions 15 and 16 are supplied by the third and fourth pumps 63*a* and 63*b*, to the first and second mixing tanks 12*a* and 12*b*. In the process, the liquid pressures of the stock solutions 15 and 16 are maintained at predetermined levels. This structure brings about an additional effect of preventing precipitation from occurring in the stock solutions 15 and 16 in the first and second stock solution tanks 13 and 14 in addition to the effects in the first embodiment.

Figure 9:
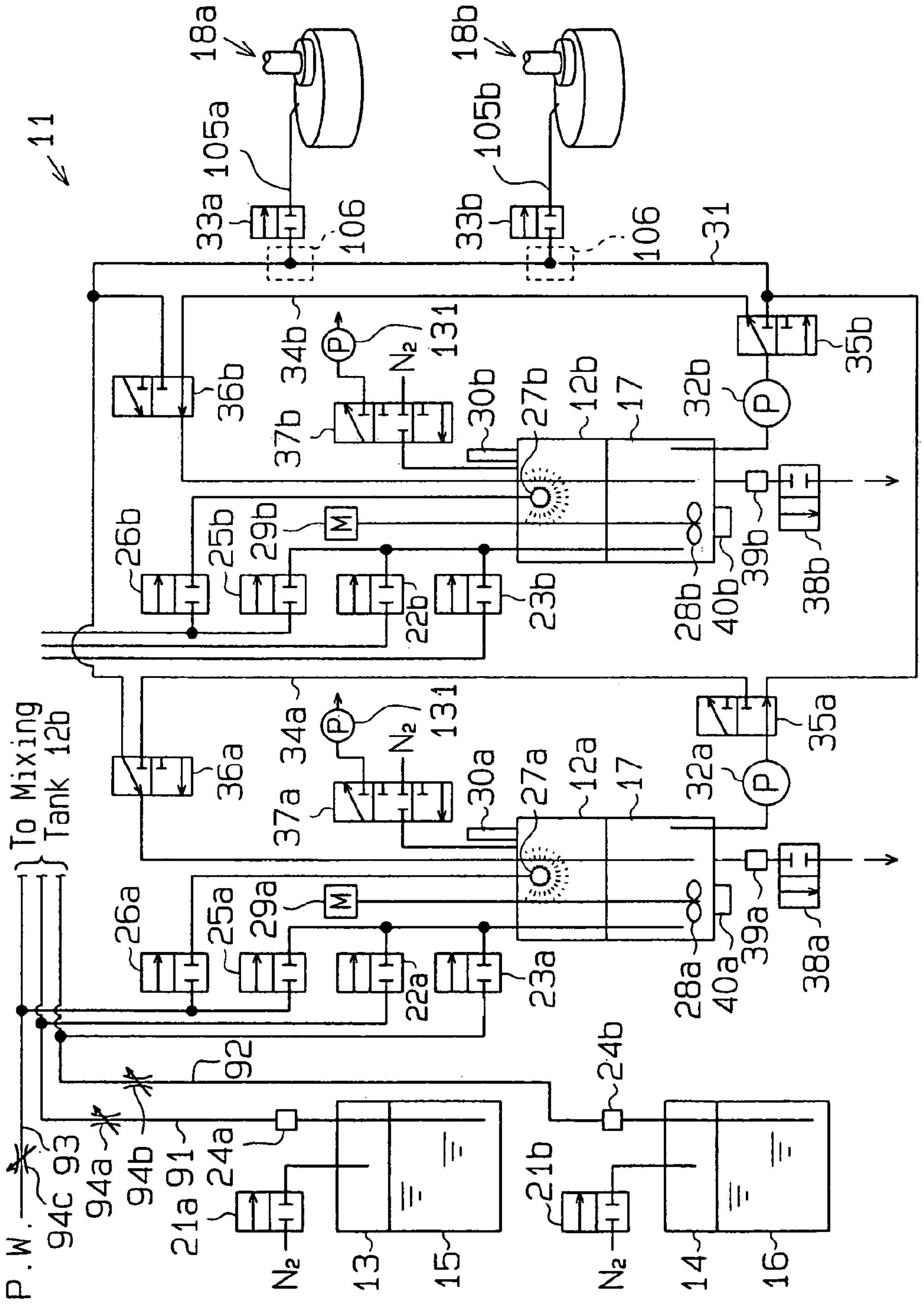
FIG. 9 is a schematic diagram showing a fifth embodiment of a slurry feeder of the present invention.

Further, referring to FIG. 9, the stock solutions 15 and 16 in the first and second stock solution tanks 13 and 14 may be supplied to the mixing tanks 12*a* and 12*b* by reducing the internal pressures of the mixing tanks 12*a* and 12*b* using vacuum pumps 131.

Further, the structure for reducing the internal pressures of the tanks 12*a* and 12*b* to deliver the stock solutions 15 and 16 to the mixing tanks 12*a*, 12*b* may be combined with any of the structure of force-feeding the stock solutions 15 and 16 in the first to third embodiments. Further, in the first embodiment, one for the sub-circulating pipes 34*a*, 34*b* may be omitted. In this case, the first and second mixing tanks 12*a* and 12*b* use a single sub-circulating pipe alternately by operating a selector valve.

Further, it is also understood that the level sensors 40*a* and 40*b* may be omitted.

Three or more mixing tanks, i.e. first to third mixing tanks, may also be incorporated. In this case, when the slurry 17 in one mixing tank is being supplied, the other two mixing tanks are subjected to flushing. The slurries 17 in the first to third mixing tanks are supplied sequentially.

In the foregoing embodiments, a suspension containing abrasive grains of, for example, colloidal silica in place of alumina, may be used as a stock solution.

The present invention may be embodied in chemicals supplying apparatus which supply chemicals other than slurries 17. The present invention may be embodied, for example, in a chemical supplying apparatus which supplies a chemical containing fluoric acid and pure water or a chemical containing fluoric acid plus ammonia plus pure water. Such chemicals are typically employed in a step of removing impurities formed on the surface of wafers after an etching treatment. Since these chemicals undergo changes in the concentrations of components due to evaporation of pure water or ammonia, the conventional chemicals supplying apparatus are inadequate. However, according to the chemicals supplying apparatus (slurry feeders) in the foregoing embodiments, chemicals are prepared in small-capacity mixing tanks by mixing and diluting stock solutions immediately before they are supplied, and the chemicals are supplied and used up before the pure water evaporates. Accordingly, fresh chemicals are supplied.

In the first embodiment, while two CMP units 18*a* and 18*b* are connected to the main circulating pipe 31, a structure in which only one CMP unit or three or more CMP units are connected to the main circulating pipe 31 is possible. Further, in the second and third embodiments, one CMP unit or three or more CMP units may be incorporated. Each CMP unit in the second embodiment may be provided with a mixing tank and peripheral elements, while each CMP unit in the third embodiment may be provided with a circulating tank and peripheral elements.

In the third embodiment, slurries prepared by diluting the stock solutions 15, 16 in the circulating tanks 72*a* and 72*b*, and mixing the diluted stock solutions in the mixing sections 73*a* and 73*b*, respectively, are supplied to the CMP units 18*a* and 18*b*. However, the slurries supplied to the CMP units 18*a* and 18*b* may be prepared by carrying out mixing of the stock solutions 15, 16 and dilution with pure water in the mixing sections 73*a* and 73*b*, respectively.

In the foregoing embodiments, when the stock solution tanks contain diluted stock solutions, the elements and the procedures (steps) for supplying diluting pure water to the first and second mixing tanks 12*a*, 12*b* in the first and second embodiments and to the first and second circulating tanks 72*a*, 72*b* in the third embodiment may be omitted. Further, the structure of the slurry feeders 11, 61 and 71 and the operations of the control units 41 may be simplified.

In the foregoing embodiments, other inert gases such as of argon may be employed in place of the nitrogen gas.

Therefore, the present examples and embodiments are to be considered as illustrative and not restrictive, and the invention is not to be limited to the details given herein, but may be modified within the scope and equivalence of the appended claims.

What is claimed is:

1. A method for producing a semiconductor device comprising the steps of:

mixing a plurality of stock chemicals to prepare a mixture in a first tank;

supplying the mixture from the first tank to a CMP processing unit;

starting preparation of a new batch of the mixture in a second tank when the liquid level of the mixture in the first tank drops to a first predetermined value; and supplying the mixture prepared in the second tank to the CMP processing unit when the liquid level of the mixture in the first tank drops to a second predetermined value.

2. The method according to claim 1, further comprising the steps of:

starting preparation of a new batch of the mixture in the first tank when the liquid level of the mixture in the second tank drops to a third predetermined value; and supplying the mixture prepared in the first tank to the CMP processing unit when the liquid level of the mixture in the second tank drops to a fourth predetermined value.

3. The method according to claim 2, wherein the third predetermined value corresponds to the amount of the mixture used up in the second tank during the time necessary for preparing a new batch of the mixture in the first tank.

4. The method according to claim 1, wherein each of the first and second tanks is configured to store the mixture necessary to polish a predetermined number of wafers in the CMP processing unit.

5. The method according to claim 4, wherein each of the first and second tanks has a capacity of about 20 to 30 liters.

6. The method according to claim 4, wherein the predetermined number of wafers is one lot of wafers.

7. The method according to claim 1, wherein the first predetermined value corresponds to the amount of the mixture used up in the first tank during the time necessary for preparing a new batch of the mixture in the second tank.

8. The method according to claim 1, further comprising the step of cleaning at least one of the first tank and the second tank before preparing the mixture.

9. The method according to claim 1, further comprising the step of supplying an inert gas to at least one of the first tank and the second tank when the amount of the mixture is reduced.

10. A method for producing an integrated circuit device comprising the steps of:

preparing a slurry by mixing a plurality of stock chemicals in a first tank and a second tank; and supplying the mixture from one of the first tank and the second tank to a wafer, wherein when the liquid level of the slurry in one of the first tank and the second tank reaches a predetermined level, said step of preparing the slurry includes starting preparation of a new batch of the slurry in another one of the first tank and the second tank.

* * * * *